(12) United States Patent
Mikawa et al.

(10) Patent No.: US 8,889,478 B2
(45) Date of Patent: Nov. 18, 2014

(54) METHOD FOR MANUFACTURING NONVOLATILE SEMICONDUCTOR MEMORY ELEMENT, AND NONVOLATILE SEMICONDUCTOR MEMORY ELEMENT

(75) Inventors: Takumi Mikawa, Shiga (JP); Yukio Hayakawa, Kyoto (JP); Yoshio Kawashima, Osaka (JP); Takeki Ninomiya, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/637,465

(22) PCT Filed: Nov. 18, 2011

(86) PCT No.: PCT/JP2011/006424
§ 371 (c)(1),
(2), (4) Date: Sep. 26, 2012

(87) PCT Pub. No.: WO2012/066786
PCT Pub. Date: May 24, 2012

(65) Prior Publication Data
US 2013/0015423 A1  Jan. 17, 2013

(30) Foreign Application Priority Data
Nov. 19, 2010 (JP) .................................. 2010-259561

(51) Int. Cl.
*H01L 45/00* (2006.01)
*H01L 21/8239* (2006.01)
*H01L 21/02* (2006.01)
*H01L 27/24* (2006.01)
*H01L 27/102* (2006.01)

(52) U.S. Cl.
CPC .......... *H01L 45/1233* (2013.01); *H01L 45/146* (2013.01); *H01L 27/2409* (2013.01); *H01L 45/1675* (2013.01); *H01L 27/1021* (2013.01); *H01L 45/08* (2013.01)
USPC ........... 438/104; 438/382; 438/102; 438/103; 438/85; 257/2; 257/3; 257/4; 257/5

(58) Field of Classification Search
CPC ... H01L 45/146; H01L 45/1233; H01L 45/08; H01L 27/101; H01L 45/1625; H01L 27/2436; H01L 27/2409; H01L 45/1675; H01L 27/2481; H01L 45/04; H01L 27/2463; H01L 45/145; H01L 45/1253; H01L 45/16
USPC ...................... 257/2, 3, 4, 5; 438/85, 102–104
See application file for complete search history.

(56) References Cited

U.S. PATENT DOCUMENTS 6,849,891 B1 * 2/2005 Hsu et al. ...................... 257/296
7,173,271 B2   2/2007 Chang
(Continued)

FOREIGN PATENT DOCUMENTS

| JP | 9-289287 | 11/1997 |
| JP | 2006-19688 | 1/2006 |

(Continued)

OTHER PUBLICATIONS

International Search Report issued Dec. 13, 2011 in corresponding International Application No. PCT/JP2011/006424.

(Continued)

*Primary Examiner* — Shaun Campbell
*Assistant Examiner* — Thai T Vuong
(74) *Attorney, Agent, or Firm* — Wenderoth, Lind & Ponack, L.L.P.

(57) ABSTRACT

Provided is a method for manufacturing a variable resistance nonvolatile semiconductor memory element, and a nonvolatile semiconductor memory element which make it possible to operate at a low voltage and high speed when initial breakdown is caused, and exhibit favorable diode element characteristics. The method for manufacturing the nonvolatile semiconductor memory element includes, after forming a top electrode of a variable resistance element and at least before forming a top electrode of an MSM diode element, oxidizing to insulate a portion of a variable resistance film in a region around an end face of a variable resistance layer.

7 Claims, 10 Drawing Sheets

(56) References Cited

U.S. PATENT DOCUMENTS

| | | | |
|---|---|---|---|
| 7,244,979 | B2 | 7/2007 | Iwasaki et al. |
| 7,692,178 | B2 | 4/2010 | Kawashima et al. |
| 7,919,774 | B2 | 4/2011 | Kawashima et al. |
| 8,022,502 | B2 | 9/2011 | Kanzawa et al. |
| 8,395,927 | B2 * | 3/2013 | Kreupl et al. ............... 365/148 |
| 8,574,957 | B2 * | 11/2013 | Mikawa et al. ............ 438/104 |
| 2006/0006374 | A1 | 1/2006 | Chang |
| 2006/0138506 | A1 * | 6/2006 | Iwasaki et al. ............. 257/295 |
| 2006/0170027 | A1 * | 8/2006 | Lee et al. .................... 257/314 |
| 2009/0014710 | A1 * | 1/2009 | Kawashima et al. ............ 257/5 |
| 2009/0052225 | A1 * | 2/2009 | Morimoto .................... 365/148 |
| 2009/0101885 | A1 | 4/2009 | Seko et al. |
| 2009/0283736 | A1 | 11/2009 | Kanzawa et al. |
| 2010/0200852 | A1 * | 8/2010 | Kawashima et al. .......... 257/43 |
| 2010/0264476 | A1 * | 10/2010 | Fukada ........................ 257/295 |
| 2010/0295108 | A1 * | 11/2010 | Sashida ....................... 257/295 |
| 2010/0314602 | A1 * | 12/2010 | Takano et al. ..................... 257/4 |
| 2011/0062405 | A1 * | 3/2011 | Tsukamoto et al. ............. 257/2 |
| 2011/0122680 | A1 * | 5/2011 | Ikeda et al. .................. 365/148 |
| 2011/0249486 | A1 * | 10/2011 | Azuma et al. ................ 365/148 |
| 2011/0284816 | A1 * | 11/2011 | Fujii et al. ......................... 257/4 |
| 2011/0294259 | A1 | 12/2011 | Kanzawa et al. |

FOREIGN PATENT DOCUMENTS

| | | |
|---|---|---|
| JP | 2006-186260 | 7/2006 |
| JP | 2006-203098 | 8/2006 |
| JP | 2009-99854 | 5/2009 |
| JP | 2010-287683 | 12/2010 |
| WO | 2007/054277 | 5/2007 |
| WO | 2007/102483 | 9/2007 |
| WO | 2008/149484 | 12/2008 |
| WO | 2009/128142 | 10/2009 |
| WO | 2010/087211 | 8/2010 |
| WO | 2010/119671 | 10/2010 |

OTHER PUBLICATIONS

Reply to the Written Opinion issued Dec. 13, 2011 in corresponding International Application No. PCT/JP2011/006424 (with English translation).

* cited by examiner

METHOD FOR MANUFACTURING NONVOLATILE SEMICONDUCTOR MEMORY ELEMENT, AND NONVOLATILE SEMICONDUCTOR MEMORY ELEMENT

BACKGROUND OF INVENTION

1. Technical Field

The present invention relates to a method for manufacturing a nonvolatile semiconductor memory element which has a resistance value that changes according to application of a voltage pulse, and to the variable resistance nonvolatile semiconductor memory element.

2. Background Art

Recent years have seen increasing high performance in electronic devices such as mobile information devices and information appliances following the development of digital technology. With the increased high performance in these electronic devices, miniaturization and increase in speed of semiconductor elements used are rapidly advancing. Among these, application for large-capacity nonvolatile memories represented by a flash memory is rapidly expanding. In addition, as a next-generation new-type nonvolatile memory to replace the flash memory, research and development on a variable resistance nonvolatile semiconductor memory element which uses what is called a variable resistance element is advancing. Here, variable resistance element refers to an element having a property in which a resistance value reversibly changes according to electrical signals, and capable of storing information corresponding to the resistance value in a nonvolatile manner.

As an example of such variable resistance element, nonvolatile semiconductor memory elements, which are provided with variable resistance elements having variable resistance layers in which transition metal oxides of different oxygen content atomic percentage are stacked, are proposed. For example, Patent Literature 1 discloses selectively causing the occurrence of oxidation/reduction reaction in an electrode interface which is in contact with a variable resistance layer having a high oxygen content atomic percentage, to stabilize resistance change.

On the other hand, as an example of a large-capacity nonvolatile memory device incorporating the variable resistance elements, a cross point nonvolatile memory element has been proposed. For example, Patent Literature (PTL) 2 discloses an element having a configuration in which a variable resistance film is used as a memory unit and a diode element is used as a switching element. According to PTL 2, a variable resistance element includes a variable resistance layer for storing information according to a change in electric resistance in response to electric stress applied thereto, and a top electrode and a bottom electrode placed on either side of the variable resistance layer. Formed on the variable resistance element is a two-terminal nonlinear element having a nonlinear current-voltage characteristic for supplying a current bidirectionally. The memory cell is formed of a series circuit including the variable resistance element and the nonlinear element. The nonlinear element is a two-terminal element having a nonlinear current-voltage characteristic similar to that of a diode element or the like in which a current changes inconstantly with respect to a voltage change. Because current flows bidirectionally when rewriting the memory cell, a varistor (e.g., ZnO or $SrTiO_3$) having a current-voltage characteristic which is bidirectionally symmetric and nonlinear is used as the nonlinear element. With the above configuration, it is possible to supply a current with a current density of 30 $kA/cm^2$ or higher which is required for rewriting for the variable resistance element, and an increase in capacity can be realized.

CITATION LIST

Patent Literature

[PTL 1]
  International Publication No. 2008/149484
[PTL 2]
  Japanese Unexamined Patent Application Publication No. 2006-203098

SUMMARY OF INVENTION

In the above nonvolatile semiconductor memory element, to change to a state in which the resistance change stably occurs, a process called an initial breakdown is performed in which a voltage higher than the voltage used in a usual operation is first applied to a variable resistance element and a portion of the variable resistance layer having a high oxygen content atomic percentage is locally short-circuited. At that time, it is necessary to suppress, to a minimum, the distribution of an initial breakdown voltage to a transistor and parasitic resistance components other than the variable resistance element and apply a sufficient voltage to the variable resistance element. To realize the above, the Applicant of this application has already filed an invention (hereinafter referred to as the "related application") in which a size of an active area of the variable resistance layer and a leakage current are reduced by oxidizing and insulating a sidewall portion of the variable resistance layer. Here, the active area is an effective area affecting the electrical characteristics of the element and refers to a greatest cross-sectional area of an electric current flow path in the variable resistance element.

Shown in (a) to (f) in FIG. 10 are cross-sectional views illustrating a method for manufacturing main part of a 1D1R nonvolatile semiconductor memory element (a memory cell is configured of a diode element and a variable resistance element that are connected in series) including the nonvolatile memory element disclosed in the related application described above.

First, as shown in (a) in FIG. 10, above a substrate 100 above which a transistor, an underlying line, and the like are formed, a conductive layer comprising aluminum (Al) or the like is formed and patterned to form an underlying line 101. Furthermore, an insulating film is formed above the substrate 100, covering the underlying line 101, and thereafter a surface of the insulating film is planarized to form an interlayer insulating layer 102. In the interlayer insulating layer 102, a contact hole 103 connected to the underlying line 101 is formed. A contact plug 104 is formed inside the contact hole 103. A first conductive film 105M comprising tantalum nitride, a semiconductor film 106S including a nitrogen-deficient silicon nitride film, a second conductive film 107M comprising tantalum nitride, a third conductive film 108M also comprising tantalum nitride, a first variable resistance film 109aF comprising a transition metal oxide, a second variable resistance film 109bF, a fourth conductive film 110M comprising a noble metal (such as platinum, iridium, palladium, and the like) are formed above an interlayer insulating layer 102 in the stated order, covering a contact plug 104. Here, the nitrogen-deficient silicon nitride film is a silicon nitride film having a nitrogen content (atomic ratio: ratio of number of nitrogen atoms to total number of atoms) less than a silicon nitride film having a stoichiometric composition.

The stoichiometric composition of a silicon nitride film is represented as $Si_3N_4$, and the proportion of the number of atoms of Si and N (N/Si) is 1.33. Therefore, in the nitrogen-deficient silicon nitride film, the atom proportion of Si and N is greater than 0 and less than 1.33. Hereinafter, the nitrogen-deficient silicon nitride film is described as $SiN_x$.

Next, as shown in (b) in FIG. 10, the fourth conductive film 110M is patterned using a predetermined mask to form a top electrode 110 of the variable resistance element.

Next, as shown in (c) in FIG. 10, the first variable resistance film 109aF and the second variable resistance film 109bF are patterned using a top electrode 110 of variable resistance element as a mask to form a variable resistance layer 109 having a stacked structure of a first variable resistance layer 109a and a second variable resistance layer 109b.

Furthermore, in the same manner, as shown in (d) in FIG. 10, the third conductive film 108M is patterned to form a bottom electrode 108 of the variable resistance element. Thus, a variable resistance element in which the variable resistance layer 109 is interposed between the bottom electrode 108 and the top electrode 110 is formed.

Subsequently, in the same manner, as shown in (e) in FIG. 10, the second conductive film 107M, the semiconductor film 106S, and the first conductive film 105M are patterned to form a top electrode 107 of the diode element, and a semiconductor layer 106, and a bottom electrode 105 of the diode element.

Typically, the steps shown in (b) through (e) in FIG. 10 use a same mask and are implemented as a series of steps. This is because concern exists that if processing of other step is performed during the patterning (etching) of the element, the yield rate may decrease or manufacturing throughput may decrease.

Lastly, as shown in (f) in FIG. 10, by annealing the variable resistance element in an atmosphere containing oxygen, around an end face (near a side face formed as a result of the etching) of the first variable resistance layer 109a is oxidized to form an insulating region 109c. Here, the second variable resistance layer 109b initially has a high oxygen content atomic percentage and is close to an insulating layer. Thus, the second variable resistance layer 109b is hardly oxidized.

Using the manufacturing method described above, by oxidizing to insulate the sidewall portion of the variable resistance element, the size of an active area of the first variable resistance layer 109a is reduced, thereby achieving reduction of a leakage current flowing through a damaged region (mainly generated in a region around a sidewall of the variable resistance layer during the etching) in the variable resistance layer 109, lowering of the breakdown voltage, and shortening of the time required for the initial breakdown.

However, with the above-described method for manufacturing, a diode element, which does not need to be oxidized, is also oxidized. This causes degradation of rectification by the diode element. FIG. 11 shows a TEM image of a cross section of a nonvolatile semiconductor memory element formed with the above-described method of manufacturing. FIG. 11 shows that around an end face (around a side face formed as a result of the etching) of the semiconductor layer, which comprises a nitrogen-deficient silicon nitride film (SiNx), of the diode element is tarnished and oxidized about 20 nm.

Furthermore, FIG. 12 shows a current-voltage characteristic (I-V characteristics) of the diode element of the nonvolatile semiconductor memory element. FIG. 12 shows a current-voltage characteristic of the diode element alone. An MSM diode element which has a semiconductor layer interposed between electrodes allows current to flow bi-directionally and has a characteristic that allows a small current to flow at a low voltage and, as the voltage increases, allows a current to flow exponentially. In this nonvolatile semiconductor memory element, as shown in FIG. 12, when an oxygen annealing is performed in a step shown in (f) in FIG. 10 ("oxidized" data indicated with black triangle marks), a current capacity of the diode element is deteriorated as a whole as compared to the "not oxidized" data indicated with black square marks. Especially, a decrease in on-current is observed. Specifically, due to the oxidation of around the end face of the semiconductor layer of the diode element, an active area (which refers to an effective area affecting the electrical characteristics of the element and is a largest cross-sectional area in the path through which a current flow in the variable resistance element) of the semiconductor layer decreases, which leads to degradation of current drive capability of a diode element. This means that a current required for an initial breakdown and rewriting of a resistance element cannot be provided and suggests that an operation of a memory becomes extremely unstable.

An object of the present invention is to provide a method for manufacturing a variable resistance nonvolatile semiconductor memory element, and a nonvolatile semiconductor memory which make it possible to overcome the above problems, are able to operate at a low voltage and high speed when initial breakdown is caused, and exhibit favorable diode element characteristics. In particular, an object of the present invention is to provide a method for manufacturing a nonvolatile semiconductor memory element, and a nonvolatile semiconductor memory element which significantly contribute to the miniaturization and an increase in capacity of the cross point memory.

In order to achieve the aforementioned object, a method for manufacturing a nonvolatile semiconductor memory element according to an aspect of the present invention includes: depositing a first conductive film above a substrate; depositing a semiconductor film on the first conductive film; depositing a second conductive film on the semiconductor film; depositing a third conductive film on the second conductive film; depositing, on the third conductive film, a variable resistance film including a plurality of layers having different oxygen content atomic percentages; depositing a fourth conductive film on the variable resistance film; forming a top electrode of a variable resistance element by patterning the fourth conductive film; forming a variable resistance layer of the variable resistance element by patterning the variable resistance film; forming a bottom electrode of the variable resistance element by patterning the third conductive film; forming a top electrode of an MSM diode element by patterning the second conductive film; forming a semiconductor layer of the MSM diode element by patterning the semiconductor film; and forming a bottom electrode of the MSM diode element by patterning the first conductive film, the method further including, after the forming of a top electrode of a variable resistance element and at least before the forming of a top electrode of an MSM diode element, oxidizing to insulate a portion of the variable resistance film in a region around an end face of the variable resistance layer.

Using the manufacturing method described above, a sidewall portion of the variable resistance element is oxidized to insulate. Thus, the size of an active area (an effective area affecting the electrical characteristics of the element) is reduced, thereby achieving reduction of the leakage current, lowering of the initial breakdown voltage, and shortening of the time required for initial breakdown. In addition, the sidewall of the variable resistance layer is oxidized before the top electrode of the diode element is patterned. Thus, the second conductive film deposited on the entire surface serves as a barrier to oxygen diffusion, allowing fundamental prevention of oxidization of the semiconductor layer of the diode element.

Furthermore, in the above-described method for manufacturing the nonvolatile semiconductor memory element, the oxidizing may be oxidizing a portion of the variable resistance film performed between the forming of a bottom electrode of the variable resistance element and the forming of a top electrode of an MSM diode element. With this, oxidation of the semiconductor film of the diode element does not occur during the formation of the variable resistance element. Thus, the variable resistance element and the diode element can be formed by respective suitable etchings, which lead to reduction of variation in dimensions.

Furthermore, in the above-described method for manufacturing the nonvolatile semiconductor memory element, the oxidizing may be oxidizing a portion of the variable resistance film in a region around an end face of the variable resistance layer performed between the forming of a variable resistance layer and the forming of a bottom electrode of the variable resistance element. This has an effect in preventing desorption of oxygen from around the end face of the variable resistance layer. In particular, oxidization immediately after the variable resistance film is patterned shortens a time during which the variable resistance layer is left in an atmosphere, reducing factors whereby the variable resistance layer varies. In addition, an oxide region, of the sidewall, which is formed around the end face of the variable resistance layer serves as a protective layer, reducing etch damage to the variable resistance layer upon patterning the bottom electrode.

Furthermore, in the above-described method for manufacturing the nonvolatile semiconductor memory element, the oxidizing may be oxidizing a portion of the variable resistance film in a region around an end face of the variable resistance layer performed between the forming a top electrode of a variable resistance element and the forming of a variable resistance layer. With this, patterning of the variable resistance film is not performed when the oxidization process is performed, and thus the barrier to the oxygen diffusion is enhanced. Therefore, the oxidization of the semiconductor layer of the diode element can be prevented at high probability. Furthermore, if the oxidization is performed while the variable resistance film remains on the enter surface, a rate of variable resistance film oxidization increases, allowing reduction of the active area of the variable resistance element. Therefore, the leakage current can further be reduced. In addition, the variable resistance film, which is an etching target, includes a high amount of oxygen, and thus, an oxide region which is formed in the variable resistance film serves as a protective layer, thereby reducing etch damage upon patterning the variable resistance film and the third conductive film.

Furthermore, the above-described method for manufacturing the nonvolatile semiconductor memory element may further include forming, above the top electrode of the variable resistance element, an anti-stress layer having mechanical stress of a polarity opposite to a polarity of mechanical stress of the top electrode of the variable resistance element. This allows for prevention of the warping of the top electrode of the variable resistance element caused by variation in stress, even if the oxidization is performed in a state in which conductive films which are to become electrodes of respective elements and the variable resistance film which is to become the variable resistance layer remain on the entire surface.

Furthermore, the above-described method for manufacturing the nonvolatile semiconductor memory element may further include forming, before the depositing of a first conductive film, a contact plug which is connected to the first conductive film. With this, the sidewall of the variable resistance layer is oxidized before the top electrode of the diode element is patterned, and thus the second conductive film deposited on the entire surface of the third conductive film serves as a barrier to oxygen diffusion. This makes it possible to prevent the oxidization of the semiconductor film of the diode element in principle even when an oxidization process is performed to achieve lowering of the initial breakdown voltage and shortening of the time required for the initial breakdown.

Furthermore, in the above-described method for manufacturing the nonvolatile semiconductor memory element, the variable resistance layer may include a tantalum oxide layer, a hafnium oxide layer, or a zirconium oxide layer. These materials have excellent retention characteristics and allow high-speed operation. Although any of these materials if included in the variable resistance layer requires the initial breakdown at the start of the resistance change, the advantageous effects of the present invention allow the initial breakdown characteristic to be significantly stabilized.

Furthermore, a nonvolatile semiconductor memory element according to the present invention is a nonvolatile semiconductor memory element including an MSM diode element and a variable resistance element, the nonvolatile semiconductor memory element includes: a substrate; a bottom electrode of the MSM diode element formed above the substrate; a semiconductor layer formed on the bottom electrode of the MSM diode element; a top electrode of the MSM diode element formed on the semiconductor layer; a bottom electrode of the variable resistance element formed on the top electrode of the MSM diode element; a variable resistance layer formed on the bottom electrode of the variable resistance element; and a top electrode of the variable resistance element formed on the variable resistance layer, wherein the MSM diode element has an end face which is flush with an end face of the variable resistance element, and the variable resistance layer includes a first variable resistance region in which a resistance value changes and a second variable resistance region which is located around the first variable resistance region and has an insulating property and an oxygen content atomic percentage that is higher than an oxygen content atomic percentage of the first variable resistance region to allow the MSM diode element to have an active area larger than an active area of the variable resistance element.

With the above-described structure, the active area of the variable resistance element is reduced to be small. This allows for the operation at a low voltage and high speed at the time of the initial breakdown. In addition, the current required for the rewriting can also be lowered. On the other hand, a larger active area is provided in the diode element as compared to the variable resistance element. Thus, the current drive capability of the diode element does not deteriorate, which makes it possible for the diode element to sufficiently provide a current required for the initial breakdown and the rewriting for the variable resistance element.

Furthermore, the above-described nonvolatile semiconductor memory element may further include an anti-stress layer which is located above the top electrode of the variable resistance element, has mechanical stress of a polarity opposite to a polarity of mechanical stress of the top electrode of the variable resistance element, and enhances anti-stress capability with respect to the mechanical stress of the top electrode of the variable resistance element. This allows for prevention of the warping of the top electrode of the variable resistance element caused by variation in stress, even if the oxidization is performed in a state in which conductive films which are to become electrodes of respective elements and the variable resistance film which is to become the variable resistance layer remain on the entire surface.

Furthermore, the above-described nonvolatile semiconductor memory element may further include a contact plug which is located above the substrate and under the bottom electrode of the MSM diode element.

A method for manufacturing a nonvolatile semiconductor memory element, and a nonvolatile semiconductor memory according to the present invention have a stacked structure which includes: an MSM diode element which is formed on a contact plug and includes a top electrode, a semiconductor layer, and a bottom electrode; and a variable resistance element which is formed on the MSM diode element and includes a top electrode, variable resistance layer, and a bottom electrode. Before patterning of the top electrode of the diode element, a sidewall of the variable resistance layer is oxidized. With this, an active area of the variable resistance layer is reduced, and thus an initial breakdown voltage is lowered and a time required for the initial breakdown is shortened. At the same time, degradation of a drive capability of the diode element is prevented. Furthermore, when a contact plug is provided in a layer under the element, an oxidation of the contact plug can be prevented. This is because a conductive film which is not patterned functions as a barrier to oxygen diffusion, allowing fundamental prevention of oxidization of the semiconductor layer and the contact plug. The method for manufacturing the nonvolatile semiconductor memory element, and the nonvolatile semiconductor memory element according to the present invention significantly contribute, in particular, to miniaturization and increase in capacity of the crosspoint memory which includes a diode element.

DETAILED DESCRIPTION OF INVENTION

Hereinafter, embodiments of the present invention will be described with reference to the drawings. It should be noted that values of film thicknesses, diameters of holes, and the like described in each embodiment below are merely illustrative, and are not limited thereto.

(Embodiment 1)

Figure 1:
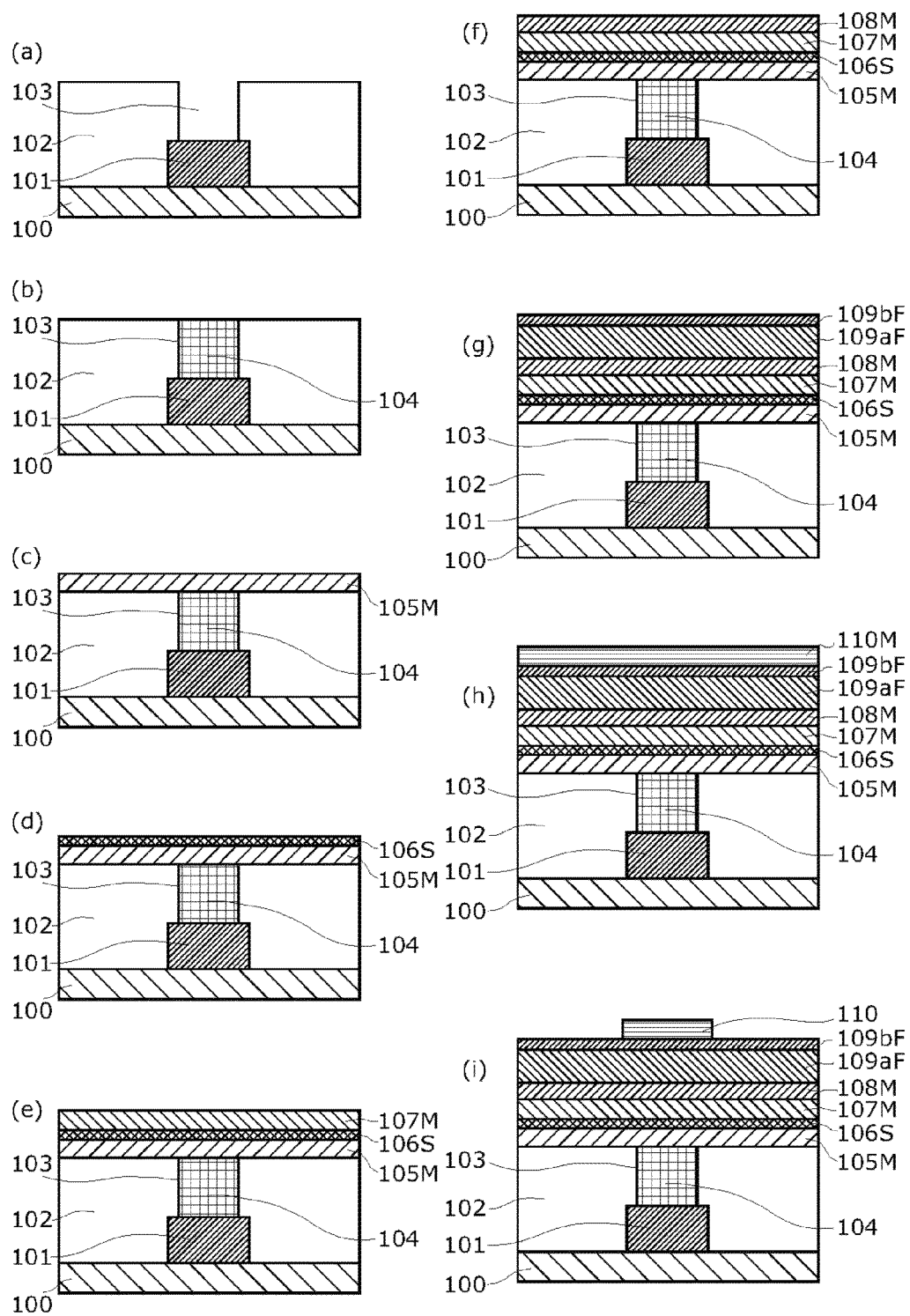
FIG. 1 is a cross-sectional view showing a method for manufacturing main part of a nonvolatile semiconductor memory element according to Embodiment 1 of the present invention.
Figure 2:
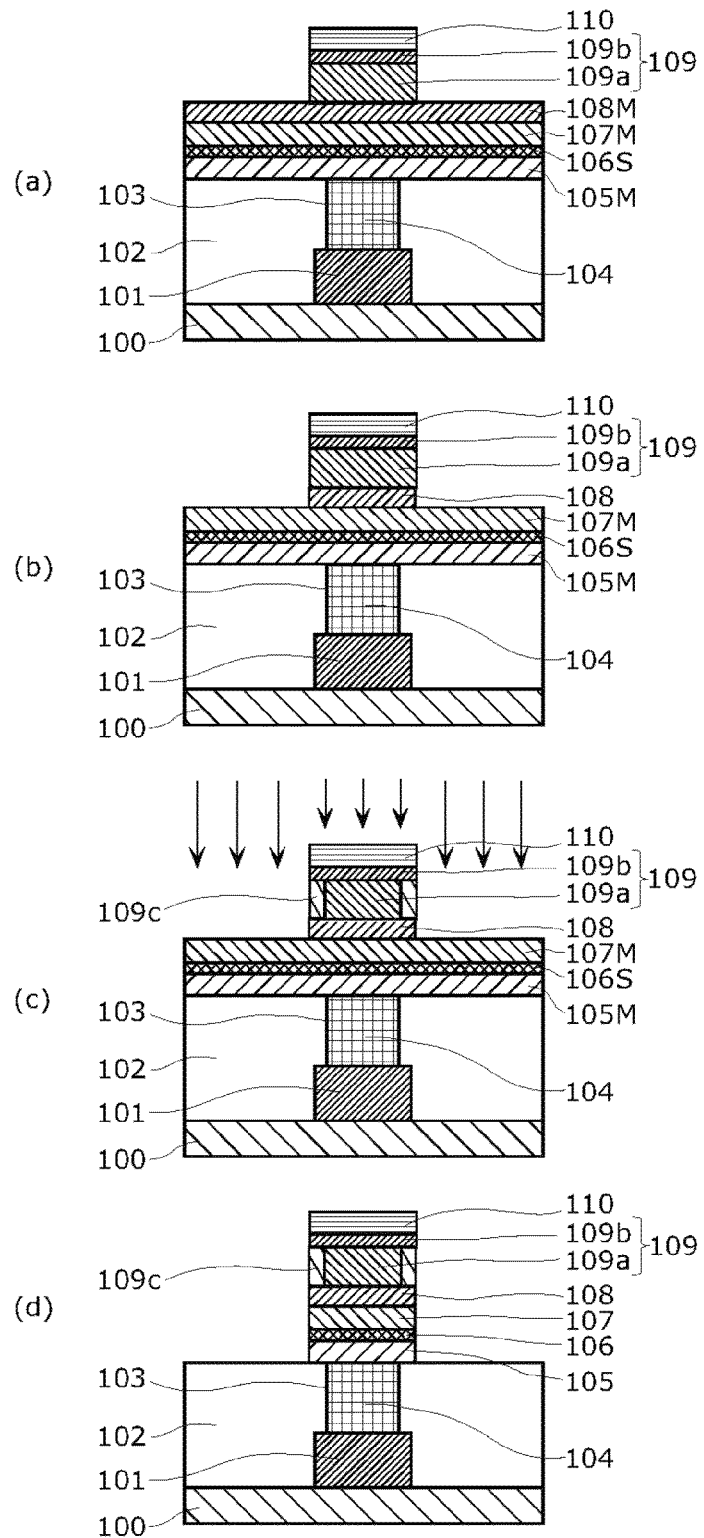
FIG. 2 is a cross-sectional view showing a method for manufacturing main part of the nonvolatile semiconductor memory element according to Embodiment 1 of the present invention.

FIG. 1 and FIG. 2 are cross-sectional views showing methods for manufacturing main part of a nonvolatile semiconductor memory element according to Embodiment of the present invention.

First, as shown in (a) in FIG. 1, above a substrate 100 above which a transistor, an underlying line, and the like are formed, a conductive layer (film thickness 400 to 600 nm) comprising aluminum or the like is formed and patterned to form an underlying line 101. Subsequently, an interlayer insulating film is formed above the substrate 100, covering the underlying line 101, and thereafter a surface of the interlayer insulating film is planarized to form an interlayer insulating layer 102 (film thickness 500 to 1000 nm). For the interlayer insulating layer 102, a plasma TEOS film is used, or in order to reduce a parasitic capacity between lines, a low-k material, such as a fluorine-containing oxide (e.g., FSG), is used. Then, the interlayer insulating layer 102 is patterned using a predetermined mask to form a contact hole 103 (diameter: 50 to 300 nm) which penetrates through the interlayer insulating layer 102 to reach the underlying line 101. Here, if a width of the underlying line 101 is smaller than a diameter of the contact hole 103, an area in which the underlying line 101 and a contact plug 104 come into contact changes due to the impact of mask misalignment, and thus, for example, cell current fluctuates. To prevent this, the width of the underlying line 101 is made greater than the diameter of the contact hole 103.

Next, as shown in (b) in FIG. 1, first, a titanium nitride layer (TiN, film thickness: 5 to 50 nm) and a titanium layer (Ti, film thickness: 5 to 30 nm) each functioning as an adhesion layer and a diffusion barrier are deposited as a bottom layer by a sputtering method, and tungsten (film thickness: 200 to 400 nm), which is a main component of a top layer, is deposited by a CVD method. As a result, the first contact hole 103 is filled with a filler material comprising tungsten as a main component. Subsequently, planarization polishing using the chemical mechanical polishing method (CMP method) is performed on the entire surface of a wafer to remove unnecessary portion of the filler material on the interlayer insulating layer 102, and thus the contact plug 104 is formed inside the contact hole 103.

Next, as shown in (c) in FIG. 1, a first conductive film 105M (film thickness: 20 to 100 nm), which later becomes a bottom electrode 105 of a diode element and comprises a tantalum nitride, is formed (deposited) on the interlayer insulating layer 102 by the sputtering method, covering the contact plug 104.

Next, as shown in (d) in FIG. 1, a semiconductor film 106S (film thickness: 5 to 30 nm), which later becomes a semiconductor layer 106 of a diode element and includes nitrogen-deficient silicon nitride film, is formed on the first conductive film 105M by a sputtering method. Here, the semiconductor film 106S is formed using what is called a reactive sputtering method in which sputtering is performed on a silicon target in an argon (Ar) and nitrogen ($N_2$) gas atmosphere. The nitrogen content atomic percentage in the film can be controlled by controlling the flow rate of the nitrogen. Thus, the current drive capability of the diode element can be appropriately designed.

Next, as shown in (e) in FIG. 1, a second conductive film 107M (film thickness: 10 to 50 nm) which later becomes a top electrode 107 of the diode element and comprises tantalum nitride, is formed on the semiconductor film 106S by a sputtering method.

Next, as shown in (f) in FIG. 1, a third conductive film 108M (thickness: 10 to 50 nm) which later becomes a bottom electrode 108 of a variable resistance element and comprises tantalum nitride, is formed on the second conductive film 107M by a sputtering method. Depending on the case, the third conductive film 108M may be continuously deposited after the step (e) in FIG. 1.

Next, as shown in (g) in FIG. 1, a variable resistance film including multiple layers having different oxygen content atomic percentages, namely, a first variable resistance film 109aF and a second variable resistance film 109bF each comprising a transition metal oxide are formed (deposited) in the stated order. The first variable resistance film 109aF has an oxygen content atomic percentage of 50 to 65 atm %, the resistivity of 2 to 50 mΩ·cm, and a film thickness of 20 to 100 nm. The second variable resistance film 109bF has an oxygen content atomic percentage of 68 to 72 atm %, the resistivity of 1E7 (namely, $1\times10^7$) mΩ·cm or greater, and a film thickness of 3 to 10 nm. Here, the first variable resistance film 109aF and the second variable resistance film 109bF are formed by what is called a reactive sputtering method in which sputtering is performed on a tantalum target in an argon (Ar) and oxygen ($O_2$) gas atmosphere. It should be noted that the first variable resistance film 109aF is a film having a low oxygen concentration and low resistance as compared to the second variable resistance film 109bF.

Next, as shown in (h) in FIG. 1, a fourth conductive film 110M, which comprises a noble metal (such as platinum (Pt), iridium (Ir), and palladium (Pd)) and is to become a top electrode 110 of the variable resistance element after being patterned, is formed (deposited) on the second variable resistance film 109bF.

Next, as shown in (i) in FIG. 1, the fourth conductive film 110M is patterned using a predetermined mask, and the patterned fourth conductive film 110M is formed into the top electrode 110 of the variable resistance element.

Next, as shown in (a) in FIG. 2, the first variable resistance film 109aF and the second variable resistance film 109bF are patterned using a predetermined mask. For example, the first variable resistance film 109aF and the second variable resistance film 109bF may be patterned using, as the mask, the top electrode 110 which comprises a difficult-to-etch material. The patterned variable resistance film is formed into a variable resistance layer 109 configured of a stacked structure of the first variable resistance layer 109a and the second variable resistance layer 109b.

Here, the first variable resistance layer 109a (the first variable resistance film 109aF) comprises a transition metal oxide comprising a first transition metal oxide such as an oxygen-deficient tantalum oxide ($TaO_x$, $0<x<2.5$) as a main component. An oxygen content atomic percentage of a second transition metal oxide comprised in the second variable resistance layer 109b (the second variable resistance film 109bF) is higher than an oxygen content atomic percentage of the first transition metal oxide comprised in the first variable resistance layer 109a. In other words, composition ratio of oxygen in the second transition metal oxide is higher than composition ratio of oxygen in the first transition metal oxide. For example, assuming that the second variable resistance layer 109b comprises a tantalum oxide ($TaO_y$), then $x<y$. When the first variable resistance layer 109a and the second variable resistance layer 109b comprise a transition metal other than tantalum, the first variable resistance layer 109a and the second variable resistance layer 109b comprise a material having a less degree of oxygen deficiency from the stoichiometric composition exhibiting insulating properties. Alternatively, an oxide of hafnium (Hf) or zirconium (Zr) can be used as the material comprised in the variable resistance layer 109 to form a variable resistance layer configured of the same stacked structure.

It should be noted that the oxygen-deficient transition metal oxide refers to an oxide having a small oxygen content (atomic ratio: ratio of number of oxygen atoms to total number of atoms) as compared to an oxide having a stoichiometric composition. When the transition metal is Ta, a stoichiometric composition of oxide is represented by $Ta_2O_5$, and the atomic ratio (O/Ta) of Ta and O is 2.5. Thus, the atomic ratio of Ta and O in the oxygen-deficient Ta-oxide is greater than 0 and smaller than 2.5.

Subsequently, as shown in (b) in FIG. 2, the third conductive film 108M is patterned using a predetermined mask to form the bottom electrode 108 of the variable resistance element. Here, in the case where the third conductive film 108M and the second conductive film 107M include films which are etched in the same manner, the etching may be stopped after a predetermined over-etching is performed, that is, a start of the etching of the third conductive film 108M may be detected using an endpoint monitor of an etching apparatus and the etching of the third conductive film 108M may be completed. Furthermore, in the above description, for the ease of understanding, the second conductive film 107M and the third conductive film 108M are individual films that are formed separately. However, the second conductive film 107M and the third conductive film 108M may also be a single film that comprises a same material.

Next, as shown in (c) in FIG. 2, in a state in which the second conductive film 107M is not patterned, annealing is performed in an atmosphere containing oxygen (hereinafter, simply referred to as annealing) (temperature: 300 to 450 degrees Celsius). In this way, around an end face (around a side face formed as a result of the etching) of the first variable resistance layer 109a is oxidized to be insulated, and an insulating region 109c is thus formed. At this time, since the second variable resistance layer 109b has a high oxygen content atomic percentage, the degree of oxidation during this annealing is low as compared to the degree of oxidation of the first variable resistance layer 109a. In other words, when the second variable resistance layer 109b is initially close to an insulating layer, the second variable resistance layer 109b is hardly oxidized. In addition, the oxidation is performed in a state in which a surface of the second conductive film 107M is exposed. Thus, at most, an oxide layer (not shown) is formed on the surface of the second conductive film 107M. In other words, the second conductive film 107M functions as a barrier to oxygen diffusion. Thus, the diode element (especially the semiconductor film) is not oxidized.

Lastly, as shown in (d) in FIG. 2, the second conductive film 107M, the semiconductor film 106S, and the first conductive film 105M are patterned using a predetermined mask. For example, the second conductive film 107M, the semiconductor film 106S, and the first conductive film 105M may be patterned using, as the mask, the top electrode 110 which comprises a difficult-to-etch material. By this patterning, the top electrode 107 of the diode element, the semiconductor layer 106, and the bottom electrode 105 of the diode element are formed so as to form an MSM diode element in which the semiconductor layer 106 is interposed between the bottom electrode 105 and the top electrode 107.

Typically, the subsequent steps include a step of covering the variable resistance element with an interlayer insulating film, a step of forming a contact plug which is connected to the top electrode of the variable resistance element, a step of forming an overlying line which is connected to the contact plug, and the like (not shown). By carrying out these steps, the nonvolatile semiconductor memory element according to Embodiment 1 of the present invention is obtained.

Using the manufacturing method described above, in the stacked structure of the diode element and the variable resistance element, a sidewall of the variable resistance layer 109 is oxidized before the formation of the top electrode 107 of the diode element. With this, a size of an active area of the variable resistance layer 109 is reduced and thus it is possible to lower the breakdown voltage and shorten the time required for the initial breakdown. At the same time, it is possible to prevent deterioration of current drive capability caused by the oxidation of the diode element.

Figure 3:
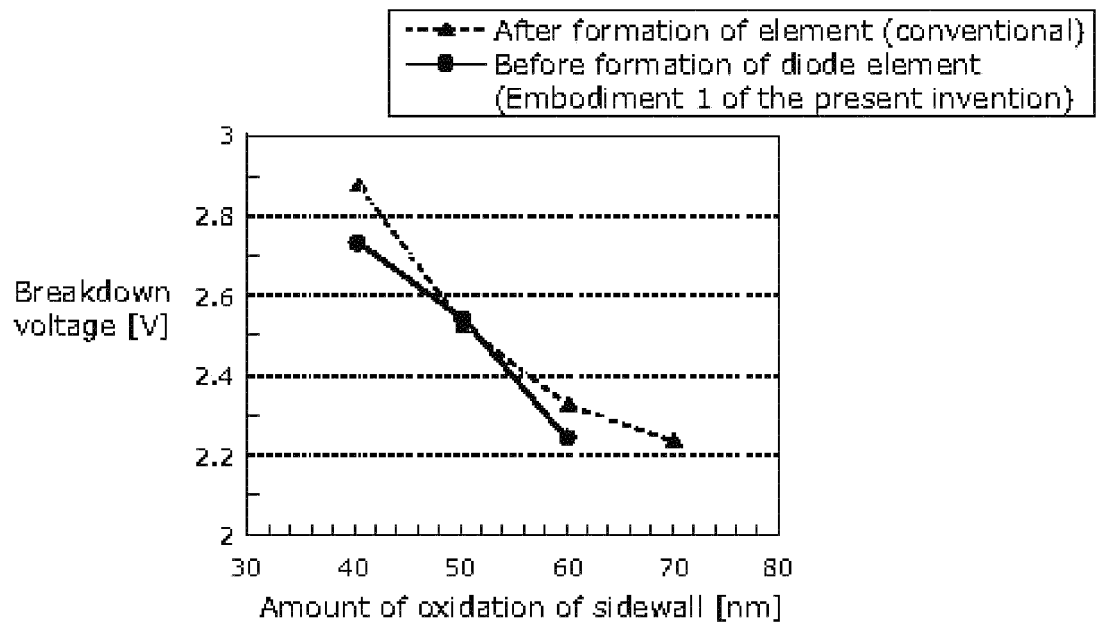
FIG. 3 is a graph showing relationship between an amount of oxidation of a sidewall and an initial breakdown voltage (initial breakdown voltage characteristics) of the nonvolatile semiconductor memory element according to Embodiment 1 of the present invention.
Figure 10:
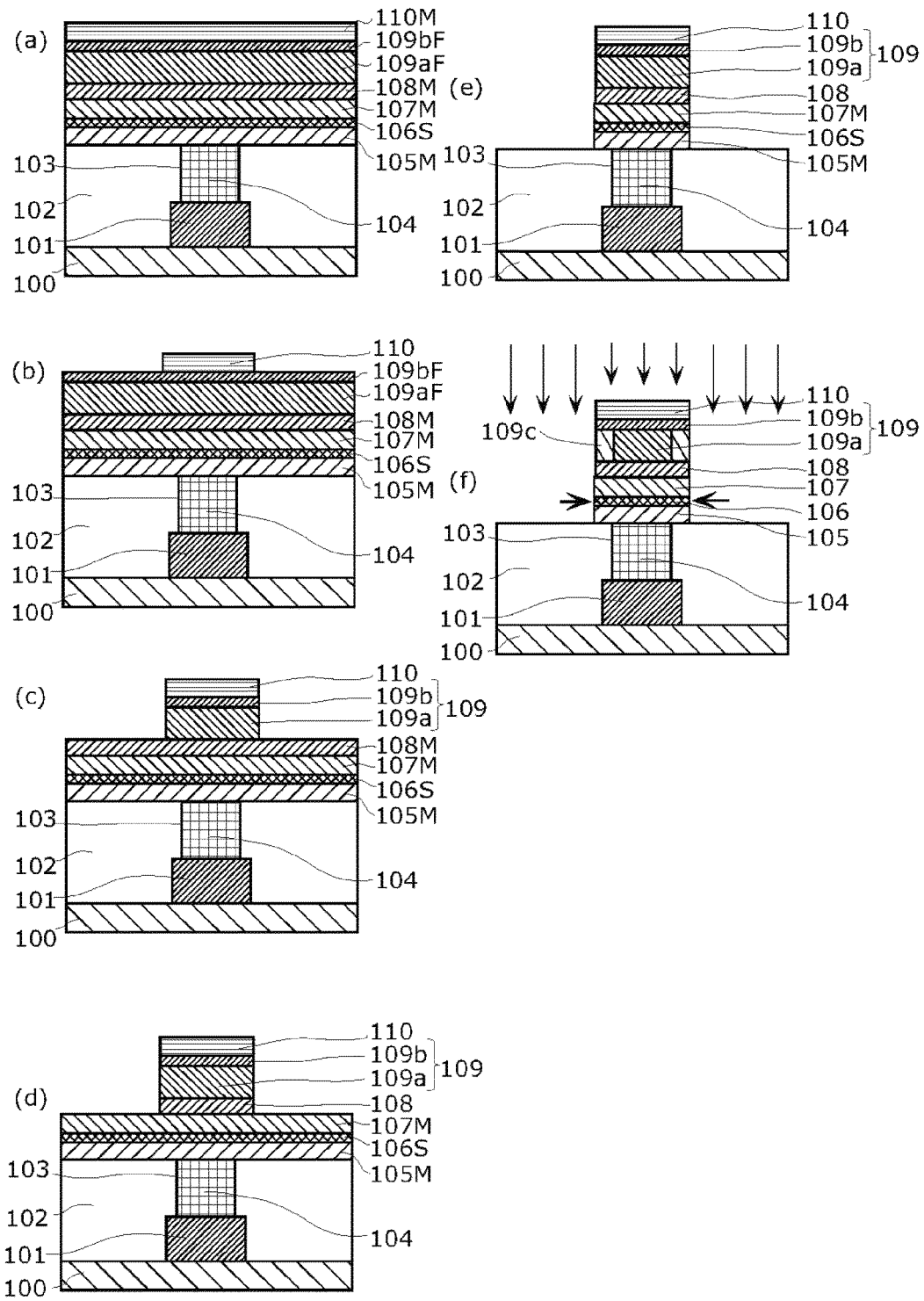
FIG. 10 is a cross-sectional view showing a method for manufacturing main part of a nonvolatile semiconductor memory element.
Figure 11:
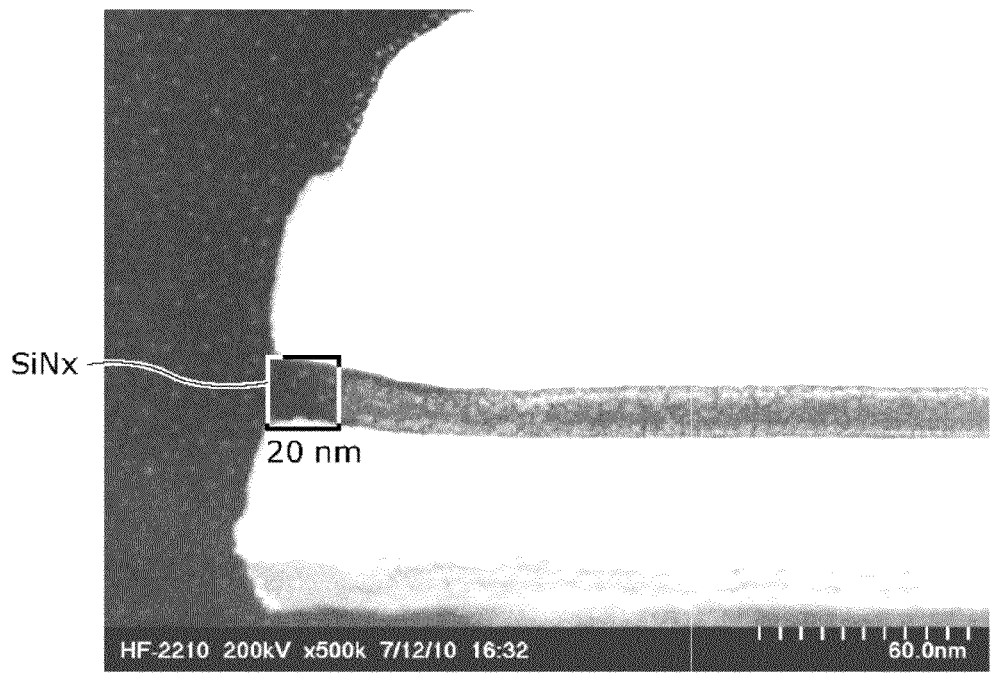
FIG. 11 is a cross-sectional TEM image of the nonvolatile semiconductor memory element.
Figure 12:
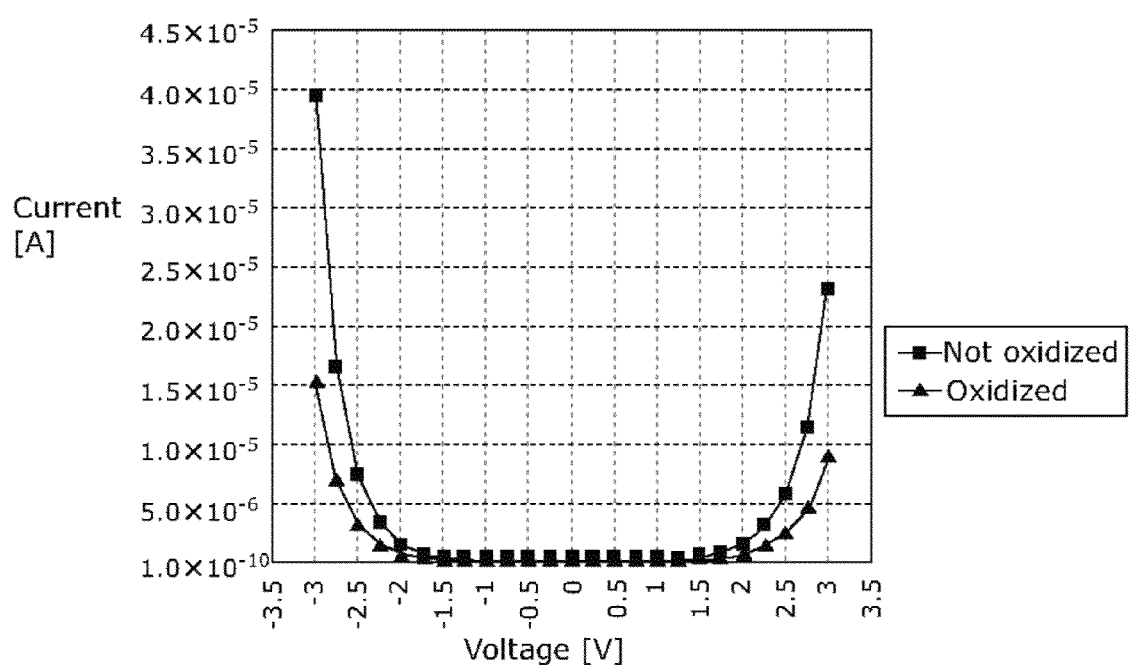
FIG. 12 is a graph plotting I-V characteristics of a diode element of the nonvolatile semiconductor memory element.

FIG. 3 is a characteristic chart showing an amount of oxidation of the sidewall and the initial breakdown voltage of the nonvolatile semiconductor memory element according to the embodiment 1 of the present invention that is created by the manufacturing method described above. In FIG. 3, the amount of oxidation of the sidewall of the variable resistance layer 109 is indicated on the horizontal axis, and the initial breakdown voltage of the variable resistance element is indicated on the vertical axis. To obtain the amount of oxidation of the sidewall, a monitor wafer having the variable resistance layer 109 formed on the entire wafer surface is used. The surface of the monitor wafer is oxidized for a same time period for which the sidewall is oxidized. The amount of oxidation of the sidewall is an estimated amount obtained by measuring the amount of oxidation proceeding in a vertical direction from the surface of the variable resistance layer 109 with an optical film thickness gauge. Due to effects from other factors, the actual amount of oxidation proceeding in the sidewall of the variable resistance element may be different from the amount of oxidation of the sidewall measured using the monitor wafer. It is, however, probable that the qualitative characteristics remain the same. From FIG. 3, as with the manufacturing method shown in FIG. 10 in which the annealing is performed after the formation of the variable resistance element (after the formation of the bottom electrode 108), it is confirmed that increase in the amount of oxidation of the sidewall leads to the reduction of the active area of the variable resistance element, and the advantageous effects of lowering of the initial breakdown voltage is produced.

Figure 4:
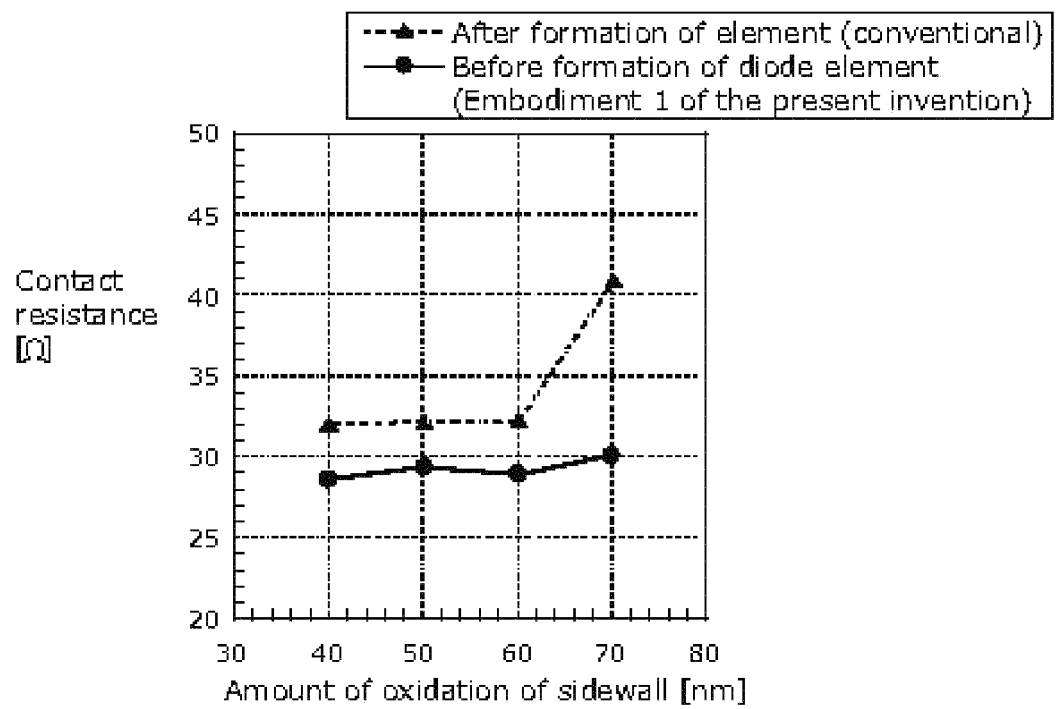
FIG. 4 is a graph showing relationship between the amount of oxidation of the sidewall and contact resistance of the nonvolatile semiconductor memory element according to Embodiment 1 of the present invention.

FIG. 4 is a characteristic chart showing an amount of oxidation of the sidewall and contact resistance of the contact plug 104 of the nonvolatile semiconductor memory element according to Embodiment 1. In FIG. 4, the amount of oxidation of the sidewall of the variable resistance layer is indicated on the horizontal axis, and the contact resistance of the contact plug 104 is indicated on the vertical axis. FIG. 4 indicates, with the manufacturing method shown in FIG. 10 in which the annealing is performed after the formation of the variable resistance element, the contact resistance is about 32Ω when the amount of oxidation of the sidewall is 40 to 60 nm and the contact resistance is rapidly increased to more than 40Ω when the amount of oxidation of the sidewall is 70 nm. This suggests that oxygen reaches the contact plug 104 due to an increase in the amount of oxidation of the sidewall, and the contact plug 104 is oxidized. In contrast, it is indicated that, with the manufacturing method according to Embodiment 1, the contact resistance is as low as 30Ω or less and does not increase even when the amount of oxidation of the sidewall increases.

Note that the bottom electrode 108 of the variable resistance element and the top electrode 107 of the diode element may be formed as a single structure. In other words, a structure used both as the top electrode 107 of the diode element and the bottom electrode 108 of the variable resistance element may be adopted.

(Embodiment 2)

Figure 5:
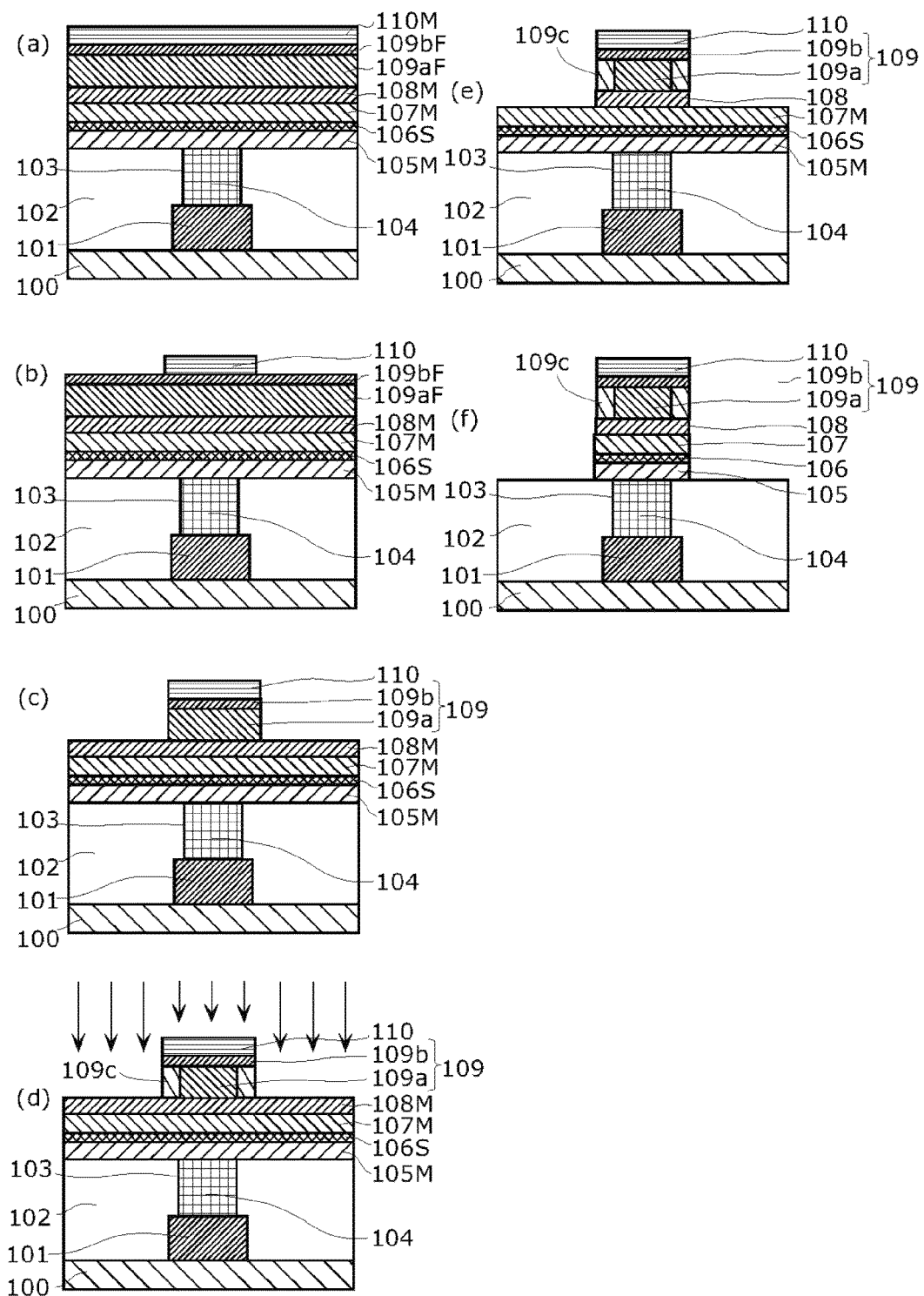
FIG. 5 is a cross-sectional view showing a method for manufacturing main part of a nonvolatile semiconductor memory element according to Embodiment 2 of the present invention.

FIG. 5 is a cross-sectional view showing a method for manufacturing main part of a nonvolatile semiconductor memory element according to Embodiment 2 of the present invention. In FIG. 5, the same components as those in FIG. 1 are assigned the same reference signs and descriptions thereof shall not be repeated.

As shown in FIG. 5, the method for manufacturing the nonvolatile semiconductor memory element according to Embodiment 2 is different from the method for manufacturing the nonvolatile semiconductor memory element according to Embodiment 1 with respect to a timing when an annealing process (a step of forming an insulating region 109c) for oxidizing the sidewall of a variable resistance element is performed. In the manufacturing method according to Embodiment 1 of the present invention, the annealing is performed after a bottom electrode 108 of the variable resistance element is patterned. In the manufacturing method according to Embodiment 2, however, the annealing is performed to form the insulating region 109c after a variable resistance layer 109 of the variable resistance element is patterned, namely, during a period from when the variable resistance layer 109 is formed to when the bottom electrode 108 is formed by etching. Thus, steps prior to a step shown in (a) in FIG. 5 are the same as the steps shown in (a) through (g) in FIG. 1. Therefore, the descriptions thereof shall not be repeated.

First, as shown in (a) in FIG. 5, a first conductive film 105M which later becomes a bottom electrode 105 of the diode element, a semiconductor film 106S which later becomes a semiconductor layer 106, a second conductive film 107M which later becomes a top electrode 107 of the diode element, a third conductive film 108M which later becomes the bottom electrode 108 of the variable resistance element, a first variable resistance film 109aF which comprises a transition metal oxide, a second variable resistance film 109bF, and a fourth conductive film 110M which later becomes a top electrode 110 of the variable resistance element are formed above an interlayer insulating layer 102, covering the contact plug 104.

Next, as shown in (b) in FIG. 5, the fourth conductive film 110M is patterned using a predetermined mask to form the top electrode 110 of the variable resistance element.

Subsequently, as shown in (c) in FIG. 5, the first variable resistance film 109aF and the second variable resistance film 109bF are patterned using a predetermined mask. For example, the first variable resistance film 109aF and the second variable resistance film 109bF may be patterned using, as the mask, the top electrode 110 which comprises a difficult-to-etch material. The patterned variable resistance film is formed into the variable resistance layer 109 configured of a stacked structure of the first variable resistance layer 109a and the second variable resistance layer 109b. In this case, it is preferable that the first variable resistance film 109aF and the second variable resistance film 109bF be patterned under conditions in which the third conductive film 108M is hardly etched. Alternatively, plasma at the time of etching may be monitored to detect the start of etching of the third conductive film 108M and may stop the etching after performing a predetermined over-etching to remove residue of etching. The reason for the above is that the greater the thickness of the third conductive film 108M remains, the more reliably the third conductive film 108M functions as a barrier to oxygen diffusion.

Next, as shown in (d) in FIG. 5, by annealing (temperature: 300 to 450 degrees Celsius), in an atmosphere containing oxygen, the variable resistance element in which the third conductive film 108M is not patterned, around an end face of the first variable resistance layer 109a (around a side face formed as a result of the etching) is oxidized to be insulated. An insulating region 109c is thus formed. At this time, since the second variable resistance layer 109b has a high oxygen content atomic percentage, the degree of oxidation during this annealing is low as compared to the degree of oxidation of the first variable resistance layer 109a. In other words, when the second variable resistance layer 109b is initially close to an insulating layer, the second variable resistance layer 109b is hardly oxidized. In addition, the oxidation is performed in a state in which a surface of the third conductive film 108M is exposed. Thus, at most, an oxide layer (not shown) is formed on the surface of the third conductive film 108M. In other words, the third conductive film 108M and the second conductive film 107M function as barriers to oxygen diffusion, suppressing the oxidation of the diode element (especially the semiconductor film).

Next, as shown in (e) in FIG. 5, the third conductive film 108M is patterned using a predetermined mask. For example, the third conductive film 108M may be patterned using, as the mask, the top electrode 110 which comprises a difficult-to-etch material. By this patterning, the bottom electrode 108 of the variable resistance element is formed. By this patterning, the variable resistance element in which the variable resistance layer 109 is interposed between the bottom electrode 108 and the top electrode 110 is formed.

Lastly, as shown in (f) in FIG. 5, the second conductive film 107M, the semiconductor film 106S, and the first conductive film 105M are patterned using a predetermined mask. For example, the second conductive film 107M, the semiconductor film 106S, and the first conductive film 105M may be patterned using, as the mask, the top electrode 110 which comprises a difficult-to-etch material. By this patterning, the top electrode 107 of the diode element, the semiconductor layer 106, and the bottom electrode 105 of the diode element are formed so as to form an MSM diode element in which the semiconductor layer 106 is interposed between the bottom electrode 105 and the top electrode 107.

Typically, the subsequent steps include a step of covering the variable resistance element with an interlayer insulating film, a step of forming a contact plug which is connected to the top electrode of the variable resistance element, a step of forming an overlying line which is connected to the contact plug, and the like (not shown). By carrying out these steps, the nonvolatile semiconductor memory element according to Embodiment 2 of the present invention is obtained.

With the manufacturing method described above, in the stacked structure of the diode element and the variable resistance element, a sidewall of the variable resistance layer 109 is oxidized before the formation of the bottom electrode 108 of the variable resistance element. This reduces a size of an active area of the variable resistance layer 109, and thus it is possible to lower the initial breakdown voltage and shorten the time required for the initial breakdown. At the same time, it is possible to prevent deterioration of current drive capability caused by the oxidation of the diode element.

As compared to Embodiment 1, in the nonvolatile semiconductor memory element according to Embodiment 2, it is certain that the third conductive film is remained at the time when the variable resistance layer 109 is oxidized. Thus, the oxidization of the diode element can be prevented at high probability.

(Variation)

In the method for manufacturing according to Embodiment 2 shown in FIG. 5, the order of stacking of the layers included in the variable resistance element may be vertically-reversed. Here, the processes until after the formation of the second conductive film 107M is the same as those in Embodiment 2 described above.

In (a) in FIG. 5, after the second conductive film 107M which becomes a top electrode 107 of the diode element is formed, the fourth conductive film 110M which becomes the top electrode 110 of the variable resistance element (here, the bottom electrode), the second variable resistance film 109bF, the first variable resistance film 109aF which comprises a transition metal oxide, the third conductive film 108M which becomes the bottom electrode 108 of the variable resistance element (here, the top electrode) are formed in the stated order. Subsequently, the bottom electrode 108, the first variable resistance film 109aF, and the second variable resistance film 109bF are patterned using a predetermined mask. At this time, in the case where the top electrode 110 of the variable resistance element comprises a difficult-to-etch material such as a noble metal, the top electrode 110 plays a role of an etching stopper.

Next, by annealing (temperature: 300 to 450 degrees Celsius), in an atmosphere containing oxygen, the variable resistance element in which the fourth conductive film 110M is not patterned, around an end face of the first variable resistance layer 109a (around a side face formed as a result of the etching) is oxidized to be insulated. An insulating region 109c is thus formed. At this time, since the second variable resistance layer 109b has a high oxygen content atomic percentage, the degree of oxidation during this annealing is low as compared to the degree of oxidation of the first variable resistance layer 109a. In other words, when the second variable resistance layer 109b is initially close to an insulating layer, the second variable resistance layer 109b is hardly oxidized. Furthermore, the oxidation is performed in a state in which a surface of the fourth conductive film 110M is exposed. However, when the fourth conductive film 110M comprises a noble metal, an oxide layer is hardly formed on the surface of the fourth conductive film 110M. In other words, the fourth conductive film 110M and the second conductive film 107M function as barriers to oxygen diffusion, suppressing the oxidation of the diode element (especially the semiconductor film).

Next, the fourth conductive film 110M, the second conductive film 107M, the semiconductor film 106S, and the first conductive film 105M are patterned using a predetermined mask. For example, a hard mask comprising a difficult-to-etch material may be formed on the third conductive film 108M and, using the pattern of the hard mask, a group which includes the third conductive film 108M, the first variable resistance film 109aF, and the second variable resistance film 109bF and a group which includes the fourth conductive film 110M, the second conductive film 107M, the semiconductor film 106S, and the first conductive film 105M may be etched under mutually different etching conditions. With these patterning, a variable resistance element which includes the bottom electrode 108 of the variable resistance element, the first variable resistance layer 109a, the second variable resistance layer 109b, and the top electrode 110 is formed, and the top electrode 107 of the diode element, the semiconductor layer 106, and the bottom electrode 105 of the diode element are also formed so as to form an MSM diode element in which the semiconductor layer 106 is interposed between the bottom electrode 105 and the top electrode 107.

Typically, the subsequent steps include a step of covering the variable resistance element with an interlayer insulating film, a step of forming a contact plug which is connected to the top electrode of the variable resistance element, a step of forming an overlying line which is connected to the contact plug, and the like (not shown). By carrying out these steps, the nonvolatile semiconductor memory element according to Embodiment 2 of the present invention is obtained.

With the manufacturing method described above, in the stacked structure of the diode element and the variable resistance element, a sidewall of the variable resistance layer 109 is oxidized before the formation of the top electrode 110 (here, the bottom electrode) of the variable resistance element. With this, a size of an active area of the variable resistance layer 109 is reduced and thus it is possible to lower the initial breakdown voltage and shorten the time required for the initial breakdown. At the same time, it is possible to prevent deterioration of current drive capability caused by the oxidation of the diode element.

As compared to Embodiment 1, in the nonvolatile semiconductor memory element according to the variation of Embodiment 2, it is certain that the fourth conductive film is remained at the time when the variable resistance layer 109 is oxidized. Thus, the oxidization of the diode element can be prevented at high probability.

(Embodiment 3)

Figure 6:
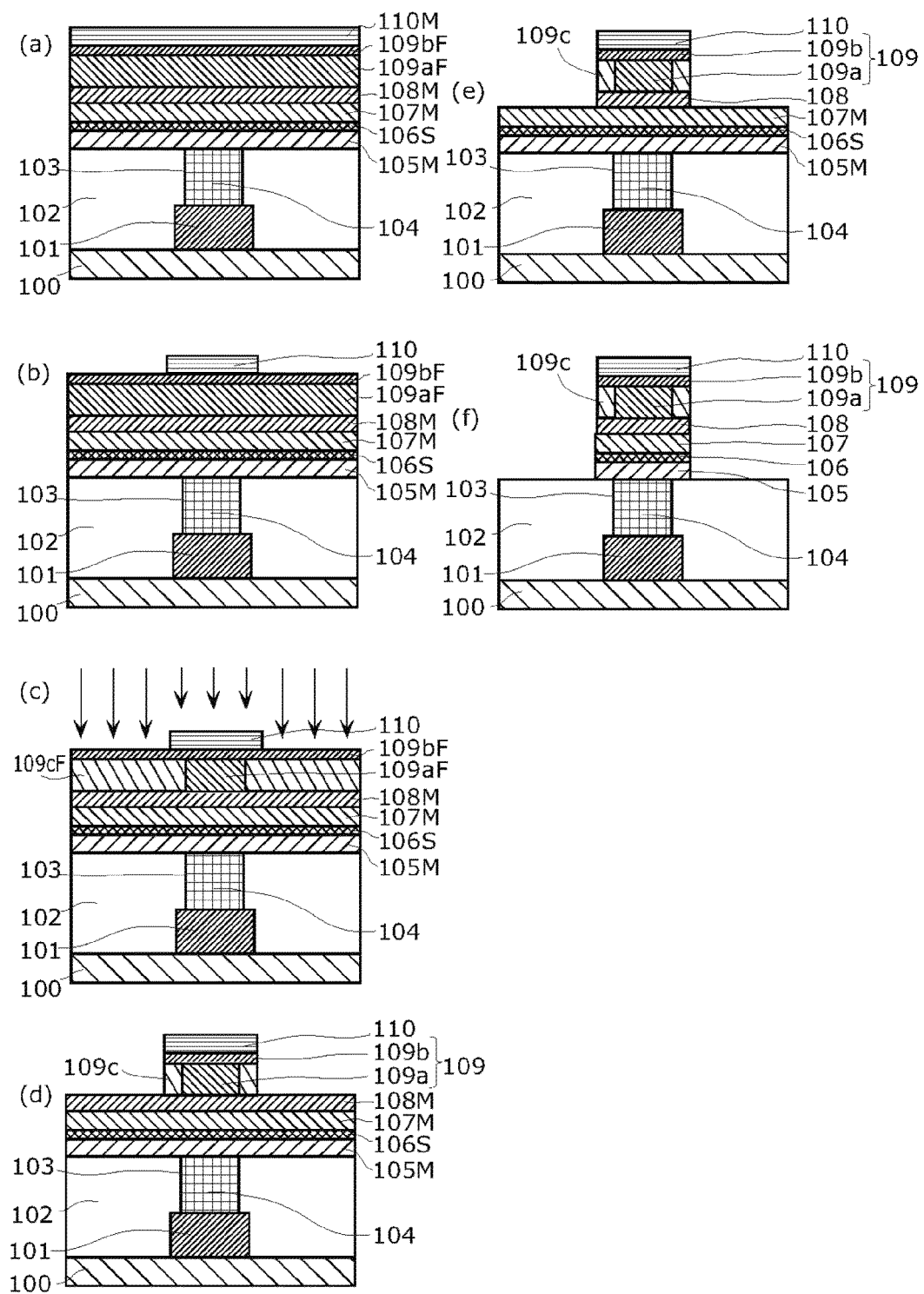
FIG. 6 is a cross-sectional view showing a method for manufacturing main part of a nonvolatile semiconductor memory element according to Embodiment 3 of the present invention.

FIG. 6 is a cross-sectional view showing a method for manufacturing main part of a nonvolatile semiconductor memory element according to Embodiment 3 of the present invention. In FIG. 6, the same components as those in FIG. 1 are assigned the same reference signs and descriptions thereof shall not be repeated.

As shown in FIG. 6, the method for manufacturing the nonvolatile semiconductor memory element according to Embodiment 3 is different from the method for manufacturing the nonvolatile semiconductor memory element according to Embodiment 1 with respect to a timing when an annealing process (a step of forming an insulating region 109c) for oxidizing a sidewall of a variable resistance element is performed. In the manufacturing method according to Embodiment 1, the annealing is performed after a bottom electrode 108 of the variable resistance element is patterned. In the manufacturing method according to Embodiment 3, however, the annealing is performed to form the insulating region 109c after a top electrode 110 of the variable resistance element is patterned, namely, during a period from when the top electrode 110 is formed to when a variable resistance layer 109 is formed. Thus, steps prior to a step shown in (a) in FIG. 6 are the same as the steps shown in (a) through (g) in FIG. 1. Therefore, the descriptions thereof shall not be repeated.

First, as shown in (a) in FIG. 6, a first conductive film 105M which later becomes a bottom electrode of a diode element 105, a semiconductor film 106S which later becomes a semiconductor layer 106, a second conductive film 107M which later becomes a top electrode 107 of the diode element, a third conductive film 108M which later becomes the bottom electrode 108 of the variable resistance element, a first variable resistance film 109aF which comprises a transition metal oxide, a second variable resistance film 109bF, and a fourth conductive film 110M which later becomes the top electrode 110 of the variable resistance element are formed above an interlayer insulating layer 102, covering the contact plug 104.

Next, as shown in (b) in FIG. 6, the fourth conductive film 110M is patterned using a predetermined mask to form the top electrode 110 of the variable resistance element. In this case, it is preferable that the fourth conductive film 110M be patterned under conditions in which the second variable resistance film 109bF is hardly etched. This is to prevent occurrence of unevenness to the remaining film thickness of the variable resistance layer 109, which leads to occurrence of variation in the amount of oxidation of the sidewall of the variable resistance layer 109 in the subsequent step of annealing.

Next, as shown in (c) in FIG. 6, by annealing (temperature: 300 to 450 degrees Celsius), in an atmosphere containing oxygen, the variable resistance element in which the first variable resistance film 109aF and the second variable resistance film 109bF are not patterned, a region of the first variable resistance film 109aF not covered by the top electrode 110 (i.e., a portion which is positioned between the top electrode 110 of the variable resistance element and the bottom electrode 108 and which later becomes around an end face of the first variable resistance layer 109a) is oxidized to be insulated. An insulating film region 109cF is thus formed. Here, the oxidization proceeds not only in a film thickness direction, but also in a direction toward the inside of the variable resistance element. As described above, since the second variable resistance layer 109b has a high oxygen content atomic percentage, a degree of oxidation during this annealing is low as compared to the first variable resistance layer 109a. When the second variable resistance layer 109b is initially close to an insulating layer, the second variable resistance layer 109b is hardly oxidized. In the oxidation described above, the first variable resistance film 109aF, the second variable resistance film 109bF, the third conductive film 108M, and the like function as barriers to oxygen diffusion. Thus, the oxidation of the diode element (especially the semiconductor film) can be prevented.

Next, as shown in (d) in FIG. 6, the first variable resistance film 109aF in which the insulating film region 109cF is formed and the second variable resistance film 109bF are patterned using a predetermined mask. For example, the top electrode 110 which comprises a difficult-to-etch material may be used as a mask to pattern the first variable resistance film 109aF, which includes the insulating film region 109cF, and the second variable resistance film 109bF. The patterned variable resistance film is formed into the variable resistance layer 109 configured of a stacked structure of the first variable resistance layer 109a and the second variable resistance layer 109b. As described above, the oxide region proceeded inside the variable resistance element (i.e., proceeded to the inside of the variable resistance element from side face of the etched insulating film region 109cF) becomes the insulating region 109c which is formed, consequently, around the end face of the patterned variable resistance element. Stated differently, around the end face of the variable resistance element is covered with the insulating region 109c including a high amount of oxygen. Thus it is possible to inhibit penetration of fluorine or the like included in an etching gas into the variable resistance layer at the time when the variable resistance layer 109 is etched.

Subsequently, as shown in (e) in FIG. 6, the third conductive film 108M is patterned using a predetermined mask to form the bottom electrode 108 of the variable resistance element.

Lastly, as shown in (f) in FIG. 6, the second conductive film 107M, the semiconductor film 106S, and the first conductive film 105M are patterned using a predetermined mask. For example, the second conductive film 107M, the semiconductor film 106S, and the first conductive film 105M may be patterned using, as the mask, the top electrode 110 which comprises a difficult-to-etch material. By this patterning, the top electrode 107 of the diode element, the semiconductor layer 106, and the bottom electrode 105 of the diode element are formed so as to form an MSM diode element in which the semiconductor layer 106 is interposed between the bottom electrode 105 and the top electrode 107.

Typically, the subsequent steps include a step of covering the variable resistance element with an interlayer insulating film, a step of forming a contact plug which is connected to the top electrode of the variable resistance element, a step of forming an overlying line which is connected to the contact plug, and the like (not shown). By carrying out these steps, the nonvolatile semiconductor memory element according to Embodiment 3 of the present invention is obtained.

With the manufacturing method described above, in the stacked structure of the diode element and the variable resistance element, a sidewall of the variable resistance layer 109 is oxidized before the formation of the top electrode 110 of the variable resistance element. With this, a size of an active area of the variable resistance layer 109 is reduced and thus it is possible to lower the initial breakdown voltage and shorten the time required for the initial breakdown. At the same time, it is possible to prevent deterioration of current drive capability caused by the oxidation of the diode element.

Figure 7:
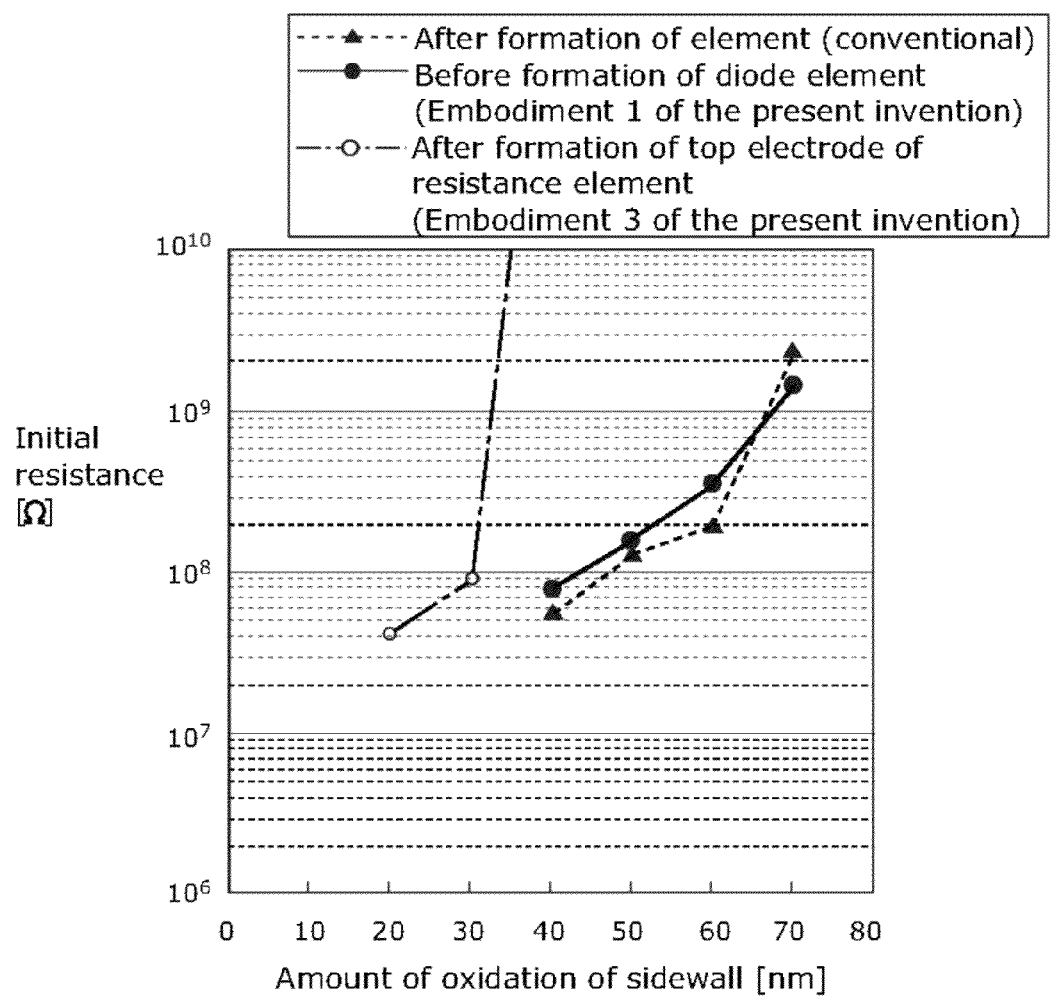
FIG. 7 is a graph showing relationship between an amount of oxidation of a sidewall and initial resistance of the nonvolatile semiconductor memory element according to Embodiment 3 of the present invention.

The nonvolatile semiconductor memory element according to Embodiment 3 that is created by the manufacturing method described above has the below-described advantages as compared to the nonvolatile semiconductor memory element according to Embodiment 1. FIG. 7 is a graph showing relationship between an amount of oxidation of a sidewall and initial resistance of the nonvolatile semiconductor memory element in a manufacturing method according to Embodiment 3. In FIG. 7, the amount of oxidation of the sidewall of the variable resistance layer 109 is indicated on the horizontal axis, and the initial resistance of the variable resistance element is indicated on the vertical axis. The amount of oxidation of the sidewall is a certain measure obtained by using a monitor wafer having a variable resistance layer (corresponding to the variable resistance layer 109) formed on the entire wafer surface. The surface of the monitor wafer is oxidized for a same time period for which the sidewall is oxidized. The amount of oxidation of the sidewall is an amount of oxidation proceeding in a vertical direction from the surface of the variable resistance layer formed on the monitor wafer (corresponding to, in (f) in FIG. 6, a horizontal direction from the surface of the sidewall of the variable resistance layer 109). FIG. 7 indicates that, as compared to the manufacturing method shown in FIG. 10 and the manufacturing method according to Embodiment 1 of the present invention, the amount of oxidation of the sidewall required to obtain a similar initial resistance (to form a similar insulating region 109c) is small in the manufacturing method according to Embodiment 3. In other words, it can be seen that, when the variable resistance layer 109 is oxidized immediately after the top electrode 110 is formed, an effective rate of sidewall oxidization increases, allowing the oxidization to occur further inside of the variable resistance element. While not clear, inference is made that the reason for this is due to the fact that when via the variable resistance layer the diffusion coefficient of oxygen in the variable resistance layer increases.

(Variation)

As with the variation in Embodiment 2, the order of stacking of the layers included in the variable resistance element may be vertically-reversed in the manufacturing method according to Embodiment 3. To manufacture such a variable resistance element, the method for manufacturing according to the variation in Embodiment 2 can be applied.

(Embodiment 4)

The FIG. 7 described above indicates that the effective rate of sidewall oxidization increases, when the annealing for oxidizing the sidewall of a variable resistance element is performed immediately after the formation of a top electrode 110. However, on the other hand, it is also found that if the oxidization of the sidewall is excessive, there can be a case where an insulating state, which has higher initial resistance than a standard initial resistance value, is reached. The analysis is made for this and has proven that the cause is the delamination of the top electrode 110. It is believed that the oxidization process performed in a state in which the variable resistance layer 109 remains on the entire surface causes a large variation in stress, thereby the top electrode 110 is affected and delaminated. A method for manufacturing according to Embodiment 4 solves this problem.

Figure 8:
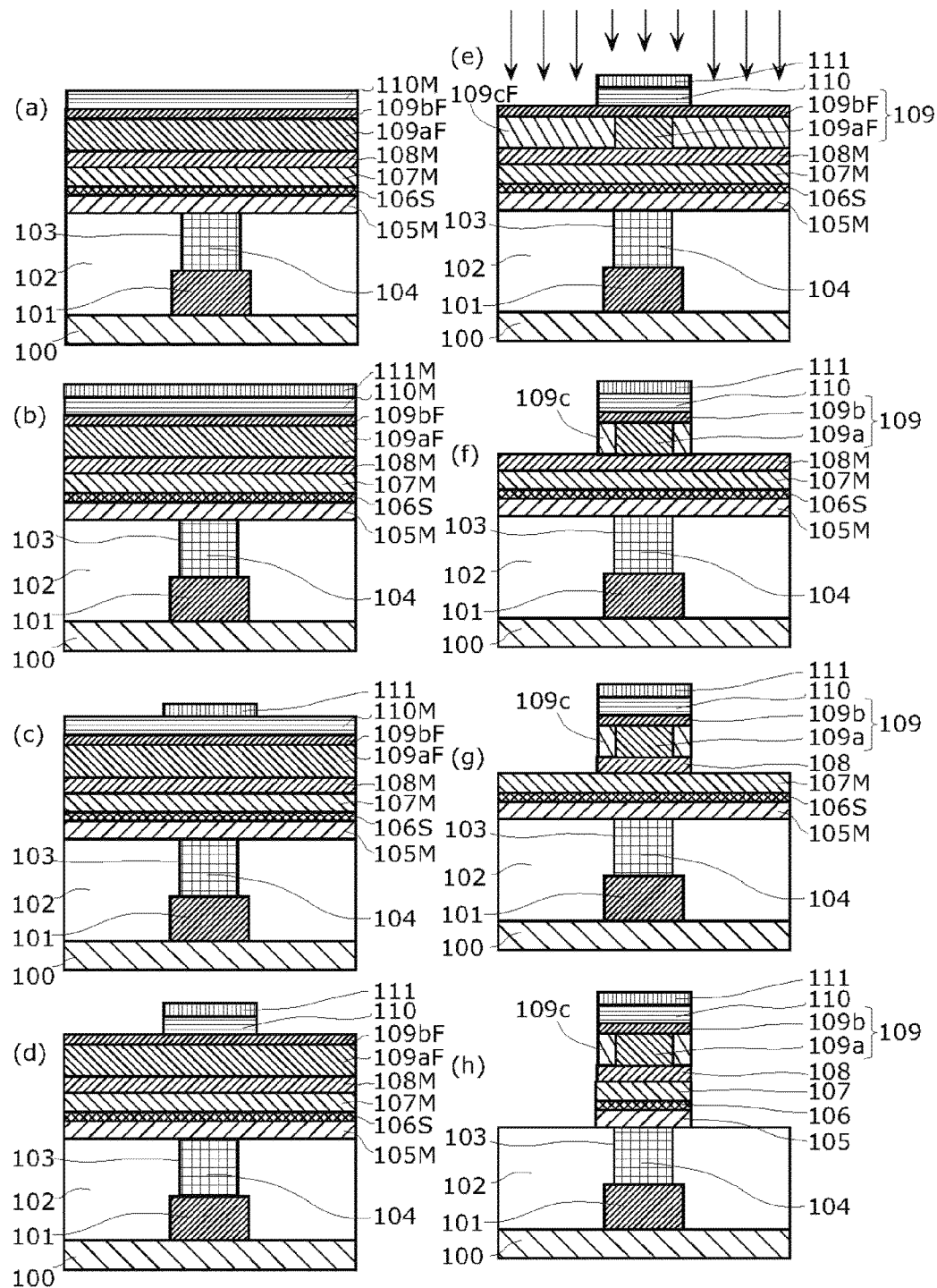
FIG. 8 is a cross-sectional view showing a method for manufacturing main part of a nonvolatile semiconductor memory element according to Embodiment 4 of the present invention.

FIG. 8 is a cross-sectional view showing a method for manufacturing main part of a nonvolatile semiconductor memory element according to Embodiment 4 of the present invention. In FIG. 8, the same components as those in FIG. 1 are assigned the same reference signs and descriptions thereof shall not be repeated.

As shown in FIG. 8, the method for manufacturing the nonvolatile semiconductor memory element according to Embodiment 4 of the present invention is different from the method for manufacturing the nonvolatile semiconductor memory element according to Embodiment 3 of the present invention in that an anti-stress layer 111 is disposed above the top electrode 110 of the variable resistance element in the manufacturing method according to Embodiment 4 of the present invention. Thus, steps prior to a step shown in (a) in FIG. 8 are the same as the steps shown in (a) through (g) in FIG. 1, and steps subsequent to the step shown in (f) in FIG. 8 are the same as the steps shown in (d) through (f) in FIG. 6. Therefore, descriptions thereof shall not be repeated.

Next, as shown in (a) in FIG. 8, a first conductive film 105M which later becomes a bottom electrode 105 of a diode element, a semiconductor film 106S which later becomes a semiconductor layer 106, a second conductive film 107M which later becomes a top electrode 107 of the diode element, a third conductive film 108M which later becomes the bottom electrode 108 of the variable resistance element, a first variable resistance film 109aF which comprises a transition metal oxide, a second variable resistance film 109bF, and a fourth conductive film 110M which later becomes the top electrode 110 of the variable resistance element are formed above the interlayer insulating layer 102, covering the contact plug 104.

Next, as shown in (b) in FIG. 8, an anti-stress film 111M is formed above the fourth conductive film 110M. In this embodiment, when the mechanical stress of the top electrode 110 of the variable resistance element is tensile stress, an anti-stress film having higher compressive stress than the tensile stress of the fourth conductive film 110M (the top electrode 110) is used as the anti-stress film 111M so as to enhance stress tolerance to a tensile stress (i.e. to suppress tensile stress) which the top electrode 110 of the variable resistance element has due to annealing performed later. In other words, for the anti-stress film 111M (later becomes the anti-stress layer 111), in order to enhance stress tolerance to a tensile stress generated in the top electrode 110 due to the annealing (i.e. due to formation of an insulating region 109c), an anti-stress film which has, as compared to the tensile stress generated in the top electrode 110, high stress in an opposite polarity (i.e., the compressive stress) that is given as an inherent property of the anti-stress film itself when the anti-stress film is formed. Here, a nitride of titanium and aluminum (TiAlN) is selected as a material comprised in the anti-stress film 111M. The anti-stress film 111M does not necessarily have to be conductive. This is because if the anti-stress film 111M is insulative, the anti-stress layer 111 may also be opened (a through hole to be filled with the contact plug may be formed, extending so that the surface of the top electrode 110 is exposed) in forming the contact which is connected to the top electrode 110 of the variable resistance element.

Next, as shown in (c) in FIG. 8, the anti-stress film 111M is patterned using a predetermined mask to form the anti-stress layer 111.

Next, as shown in (d) in FIG. 8, the fourth conductive film 110M is patterned using a predetermined mask to form the top electrode 110 of the variable resistance element. In this case, it is preferable that the fourth conductive film 110M be patterned under conditions in which the second variable resistance film 109bF is hardly etched. For example, it is preferable that the fourth conductive film 110M and the anti-stress film 111M be dry etched using a gas with which the first variable resistance film 109aF and the second variable resistance film 109bF are hardly etched. This is to prevent occurrence of unevenness to the remaining film thickness of the variable resistance film after the fourth conductive film 110M is patterned, which leads to occurrence of variation in the amount of oxidation of the sidewall in the subsequent step of annealing.

Next, as shown in (e) in FIG. 8, by annealing (temperature: 300 to 450 degrees Celsius), in an atmosphere containing oxygen, the variable resistance element in which the first variable resistance film 109aF and the second variable resistance film 109bF are not patterned, a portion of the first variable resistance film 109aF is oxidized to form an insulating region 109c. Here, the oxidization proceeds not only in a film thickness direction, but also in a direction toward the inside of the variable resistance element. As described above, since the second variable resistance film 109bF has a high oxygen content atomic percentage, a degree of oxidation during this annealing is low as compared to the first variable resistance film 109aF. When the second variable resistance film 109bF is initially close to an insulating layer, the second variable resistance film 109bF is hardly oxidized. Disposition of the anti-stress layer 111 makes it possible to inhibit warping of the top electrode 110 of the variable resistance element and prevent delamination of the top electrode 110.

Note that, although Embodiment 4 described the case in which the anti-stress layer 111 is applied to the manufacturing method according to Embodiment 3 (FIG. 6), the anti-stress layer 111 may be formed above the top electrode layer (the fourth conductive film 110M) in the manufacturing method according to Embodiment 1 (FIG. 1 and FIG. 2) and Embodiment 2 (FIG. 5).

The subsequent steps that are shown in (f) through (h) in FIG. 8 are the same as the steps described in Embodiment 3 with reference to (d) through (f) in FIG. 6. The nonvolatile semiconductor memory element according to Embodiment 4 is thus obtained.

With the manufacturing method described above, in the stacked structure of the diode element and the variable resistance element, a sidewall of the variable resistance layer 109 is oxidized before patterning of the top electrode 110 of the variable resistance element. With this, a size of an active area of the variable resistance layer 109 is reduced and thus it is possible to lower the initial breakdown voltage and shorten the time required for the initial breakdown. At the same time, it is possible to prevent deterioration of current drive capability caused by the oxidation of the diode element.

Figure 9:
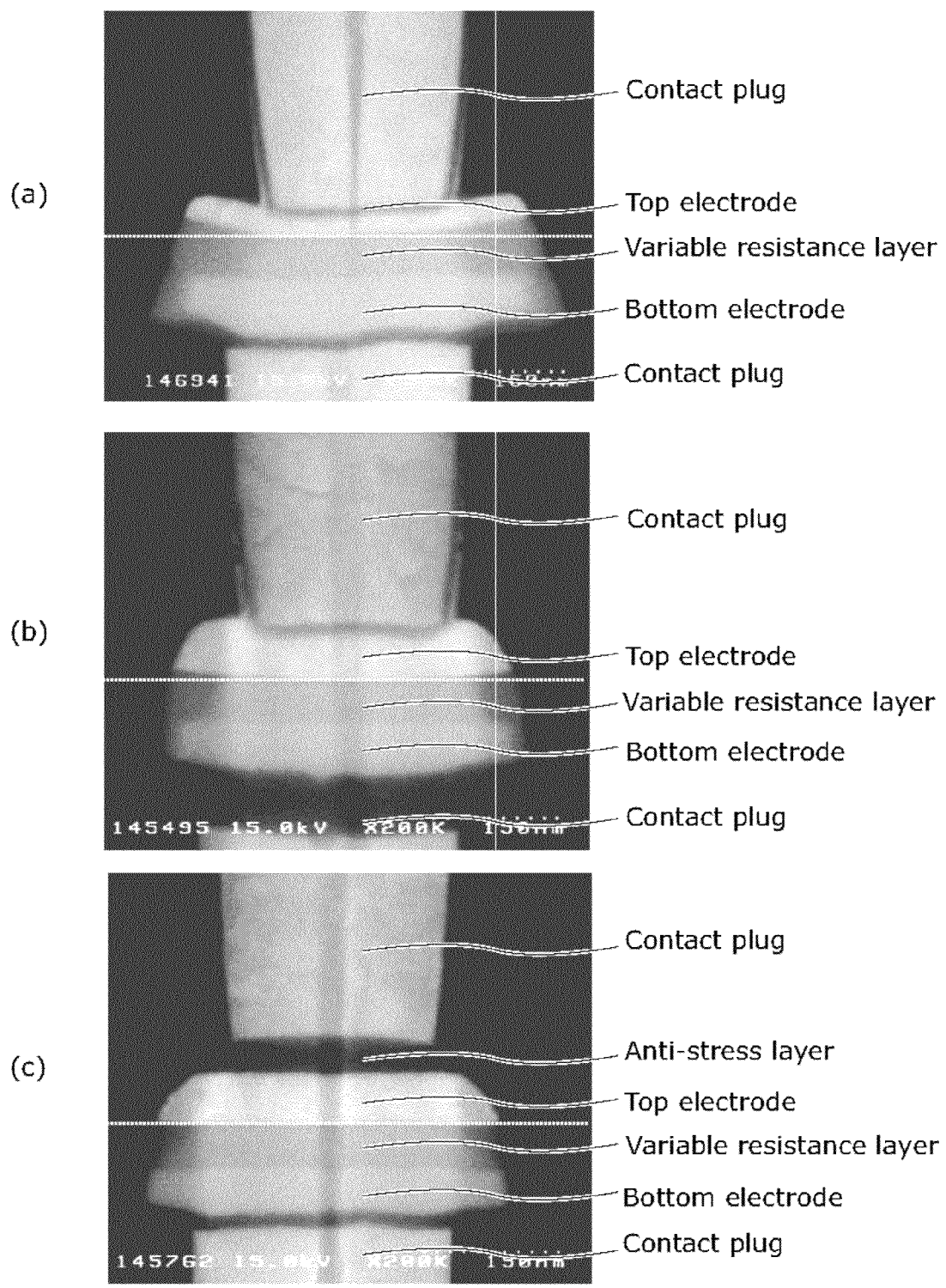
FIG. 9 is a cross-sectional SEM image of the nonvolatile semiconductor memory element according to Embodiment 4 of the present invention.

Furthermore, the nonvolatile semiconductor memory element according to Embodiment 4 which is created by the above-described manufacturing method has the below-described advantages as compared to the nonvolatile semiconductor memory element according to Embodiment 3. In (a) to (c) in FIG. 9, cross-sectional SEM images of nonvolatile semiconductor memory elements are shown. (a) to (c) in FIG. 9 are for describing characteristics of the anti-stress layer 111 and thus show nonvolatile semiconductor memory elements in which the structure of diode elements are omitted. Each of (a) and (b) in FIG. 9 shows a variable resistance element in which the anti-stress layer 111 is not disposed, suggesting prominent warping of the electrode which may lead to delamination of the top electrode 110. It is also suggested that the thinner the top electrode 110 is, the greater the amount of warping becomes, and variation in film thickness of the top electrode 110 also affects the characteristics of the variable resistance element. As shown in (c) in FIG. 9, however, it can be seen that, when the anti-stress layer 111 (a nitride of titanium and aluminum) is disposed above the top electrode 110, the top electrode 110 has no warping without delamination concerns.

Thus far, although the method for manufacturing the nonvolatile semiconductor memory element according to the present invention has been described based on the embodiments, the present invention is not limited to these embodiments. Various modifications to the embodiments that may be conceived by those skilled in the art without departing from the essence of the present invention are intended to be included in the scope of the present invention. In addition, each component in a plurality of embodiments may be arbitrarily combined within a scope not departing from the essence of the present invention.

For example, in the above-described embodiments, the transition metal oxide layer included in each of the first variable resistance layer 109a and the second variable resistance layer 109b is the tantalum oxide layer. However, other transition metal oxide layer, such as a hafnium (Hf) oxide layer or a zirconium (Zr) oxide layer, may be used insofar as the transition metal oxide layer functions as the variable resistance layer by the application of a voltage to the top electrode and the bottom electrode.

For example, in the case of adopting a stacked structure of hafnium oxide layers for the variable resistance layer 109, when assuming that the composition of a first hafnium oxide layer is $HfO_x$ and the composition of a second hafnium oxide layer is $HfO_y$, it is preferable that x approximately satisfies $0.9 \leq x \leq 1.6$ and y approximately satisfies $1.8 < y < 2.0$, and that the film thickness of the second hafnium oxide layer be no less than 3 nm and no more than 4 nm.

Furthermore, in the case of adopting a stacked structure of zirconium oxide layers for the variable resistance layer 109, when assuming that the composition of a first zirconium oxide layer is $ZrO_x$ and the composition of a second zirconium oxide layer is ZrO$_y$, it is preferable that x approximately satisfies 0.9≤x≤1.4 and y approximately satisfies 1.9<y<2.0, and that the film thickness of the second zirconium oxide layer be no less than 1 nm and no more than 5 nm.

Furthermore, in the case of adopting a stacked structure of hafnium oxide layers for the variable resistance layer 109, the first hafnium oxide layer is formed on the bottom electrode 108 with what is called a reactive sputtering method in which sputtering is performed in an argon gas and oxygen gas atmosphere using a Hf target. The second hafnium oxide layer can be formed after the forming of the first hafnium oxide layer, by exposing the surface of the first hafnium oxide layer to argon gas and oxygen gas plasma. The oxygen content atomic percentage of the first hafnium oxide layer can be easily adjusted, as with the case of the above-described tantalum oxide layer, by changing the flow ratio of the oxygen gas to the argon gas in the reactive sputtering. It should be noted that, with regard to the substrate temperature, heating is not necessary and room temperature is acceptable.

Furthermore, the film thickness of the second hafnium oxide layer can be easily adjusted through the exposure time to the argon gas and oxygen gas plasma. When the composition of the first hafnium oxide layer is represented as HfO$_x$ and the composition of the second hafnium oxide layer is represented as HfO$_y$, it is possible to realize stable resistance change characteristics when 0.9≤x≤1.6 and 1.8<y<2.0, and the film thickness of the second hafnium oxide layer is no less than 3 nm and no more than 4 nm.

In the case of adopting a stacked structure of zirconium oxide layers, the first zirconium oxide layer is formed on the bottom electrode 108 with what is called the reactive sputtering method in which sputtering is performed in an argon gas and oxygen gas atmosphere using a Zr target. The second zirconium oxide layer can be formed after the forming of the first zirconium oxide layer, by exposing the surface of the first zirconium oxide layer to argon gas and oxygen gas plasma. The oxygen content atomic percentage of the first zirconium oxide layer can be, as with the case of the above-described tantalum oxide layer, easily adjusted by changing the flow ratio of the oxygen gas to the argon gas in the reactive sputtering. It should be noted that, with regard to the substrate temperature, heating is not necessary and room temperature is acceptable.

Furthermore, the film thickness of the second zirconium oxide layer can be easily adjusted through the exposure time to the argon gas and oxygen gas plasma. When the composition of the first zirconium oxide layer is represented as ZrO$_x$ and the composition of the second zirconium oxide layer is represented as ZrO$_y$, it is possible to realize stable resistance change characteristics when 0.9≤x≤1.4 and 1.9<y<2.0, and the film thickness of the second zirconium oxide layer is no less than 1 nm and no more than 5 nm.

Furthermore, the respective materials of the top electrode 110 and the bottom electrode 108 in the above embodiments are examples, and other materials may be used. For example, aside from Pt, Ir, and Pd, gold (Au), copper (Cu), silver (Ag), and so on, may be used as the top electrode 110, and, aside from TaN, tungsten (W), nickel (Ni), and so on, may be used as the bottom electrode 108.

Moreover, in the above embodiments, order in which the first variable resistance layer 109a and the second variable resistance layer 109b are stacked in the stacked structure included in the variable resistance element may be vertically-reversed. Stated differently, after the second variable resistance film 109bF and the first variable resistance film 109aF are sequentially formed above the third conductive film 108M, the second variable resistance film 109bF and the first variable resistance film 109aF may be patterned and oxidized to form the variable resistance element. In this case, Pt, Ir, Pd, Au, copper, silver, or the like may be used for the third conductive film 108M (the bottom electrode 108 of the variable resistance element) to which the second variable resistance film 109bF having a high oxygen content atomic percentage is connected, and TaN, W, Ni, or the like may be used for the top electrode 110 which is connected to the first variable resistance film 109aF having a low oxygen content atomic percentage.

Note that the bottom electrode 108 of the variable resistance element and the top electrode 107 of the diode element may be formed as a single structure. In other words, a structure used both as the top electrode 107 of the diode element and the bottom electrode 108 of the variable resistance element may be adopted.

The present invention provides a method for manufacturing a variable resistance nonvolatile semiconductor memory element, and is useful in various electronic device fields that use a nonvolatile memory because the present invention can realize a nonvolatile memory which operates in a stable manner and is highly reliable.

REFERENCE SIGNS LIST

100 Substrate
101 Underlying line
102 Interlayer insulating layer
103 Contact hole
104 Contact plug
105 Bottom electrode of diode element
105M First conductive film
106 Semiconductor layer
106S Semiconductor film
107 Top electrode of diode element
107M Second conductive film
108 Bottom electrode of variable resistance element
108M Third conductive film
109 Variable resistance layer
109a First variable resistance layer
109aF First variable resistance film
109b Second variable resistance layer
109bF Second variable resistance film
109c Insulating region (second variable resistance region)
109cF Insulating film region
110 Top electrode of variable resistance element
110M Fourth conductive film
111 Anti-stress layer
111M Anti-stress film

The invention claimed is:
1. A method for manufacturing a nonvolatile semiconductor memory element, the method, comprising:
depositing a first conductive film above a substrate;
depositing a semiconductor film on the first conductive film;
depositing a second conductive film on the semiconductor film;
depositing a third conductive film on the second conductive film;
depositing, on the third conductive film, a variable resistance film including a plurality of layers having different oxygen content atomic percentages;
depositing a fourth conductive film on the variable resistance film;
forming a top electrode of a variable resistance element by patterning the fourth conductive film;

forming a variable resistance layer of the variable resistance element by patterning the variable resistance film;

forming a bottom electrode of the variable resistance element by patterning the third conductive film;

forming a top electrode of a metal-semiconductor-metal (MSM) diode element by patterning the second conductive film;

forming a semiconductor layer of the MSM diode element by patterning the semiconductor film;

forming a bottom electrode of the MSM diode element by patterning the first conductive film; and after the forming of a top electrode of a variable resistance element and at least before the forming of a top electrode of an MSM diode element, oxidizing to insulate a portion of the variable resistance film in a region around an end face of the variable resistance layer, wherein, in the oxidizing, the second conductive film before the patterning serves as a barrier to oxygen diffusion to reduce oxidization of the semiconductor film.

2. The method for manufacturing a nonvolatile semiconductor memory element according to claim 1, wherein the oxidizing is oxidizing a portion of the variable resistance film performed between the forming of a bottom electrode of the variable resistance element and the forming of a top electrode of a metal-semiconductor-metal (MSM) diode element.

3. The method for manufacturing a nonvolatile semiconductor memory element according to claim 1, wherein the oxidizing is oxidizing a portion of the variable resistance film performed between the forming of a variable resistance layer and the forming of a bottom electrode of the variable resistance element.

4. The method for manufacturing a nonvolatile semiconductor memory element according to claim 1, wherein the oxidizing is oxidizing a portion of the variable resistance film performed between the forming a top electrode of a variable resistance element and the forming of a variable resistance layer.

5. The method for manufacturing a nonvolatile semiconductor memory element according to claim 1, further comprising forming, above the top electrode of the variable resistance element, an anti-stress layer having mechanical stress of a polarity opposite to a polarity of mechanical stress of the top electrode of the variable resistance element.

6. The method for manufacturing a nonvolatile semiconductor memory element according to claim 1, further comprising forming, before the depositing of a first conductive film, a contact plug which is connected to the first conductive film.

7. The method for manufacturing a nonvolatile semiconductor memory element according to claim 1, wherein the variable resistance layer includes a tantalum oxide layer, a hafnium oxide layer, or a zirconium oxide layer.

* * * * *